US008174270B2

(12) United States Patent
Hyde et al.

(10) Patent No.: US 8,174,270 B2
(45) Date of Patent: May 8, 2012

(54) SYSTEMS AND METHODS FOR ASSESSING STANDOFF CAPABILITIES OF IN-SERVICE POWER LINE INSULATORS

(75) Inventors: Roderick A. Hyde, Redmond, WA (US); Muriel Y. Ishikawa, Livermore, CA (US); Jordin T. Kare, Seattle, WA (US); David B. Tuckerman, Lafayette, CA (US); Lowell L. Wood, Jr., Bellevue, WA (US); Victoria Y. H. Wood, Livermore, CA (US)

(73) Assignee: The Invention Science Fund I, LLC

( * ) Notice: Subject to any disclaimer, the term of this patent is extended or adjusted under 35 U.S.C. 154(b) by 396 days.

(21) Appl. No.: 12/460,455

(22) Filed: Jul. 17, 2009

(65) Prior Publication Data

US 2011/0012615 A1    Jan. 20, 2011

(51) Int. Cl.
*H01H 31/12* (2006.01)

(52) U.S. Cl. ........................................ 324/551; 324/557

(58) Field of Classification Search .................. 324/541, 324/544, 551, 552
See application file for complete search history.

(56) References Cited

U.S. PATENT DOCUMENTS

| | | | |
|---|---|---|---|
| 711,150 A | 10/1902 | Bruggeman | |
| 1,905,412 A * | 4/1933 | Kasson | 324/552 |
| 2,724,771 A | 11/1955 | McKay | |
| 3,654,520 A | 4/1972 | Graneau | |
| 3,982,158 A | 9/1976 | Knauer | |
| 4,074,076 A | 2/1978 | Zrudsky | |
| 4,093,968 A | 6/1978 | Shirey | |
| 4,161,008 A | 7/1979 | Zimmermann et al. | |
| 4,184,186 A | 1/1980 | Barkan | |
| 4,263,635 A | 4/1981 | Welk | |
| 4,409,428 A | 10/1983 | Dey et al. | |
| 4,446,916 A | 5/1984 | Hayes | |
| 4,823,022 A | 4/1989 | Lindsey | |
| 5,191,503 A | 3/1993 | Kawamura et al. | |
| 5,313,106 A | 5/1994 | Swanson | |
| 5,543,597 A | 8/1996 | Watanabe et al. | |
| 5,585,611 A | 12/1996 | Harvey et al. | |
| 5,608,328 A | 3/1997 | Sanderson | |
| 5,638,254 A | 6/1997 | Annou et al. | |
| 5,940,547 A | 8/1999 | Schumacher et al. | |
| 5,991,141 A | 11/1999 | Mikli et al. | |
| 6,075,684 A | 6/2000 | Duba et al. | |
| 6,172,488 B1 | 1/2001 | Mizutani et al. | |
| 6,226,163 B1 | 5/2001 | Bernhoff et al. | |

(Continued)

FOREIGN PATENT DOCUMENTS

JP    03-182016 A    8/1991

(Continued)

OTHER PUBLICATIONS

PCT International Search Report; International App. No. PCT/US10/02019; Sep. 13, 2010; pp. 1-2.

(Continued)

*Primary Examiner* — Vincent Q Nguyen

(57) ABSTRACT

A high voltage power transmission system includes an insulator arranged to electrically isolate a live power transmission line and a testing device in physical contact with the insulator, The teat device measures properties of the insulator by conducting electrical tests of and/or optical examination on the insulator while it is in-service to electrically isolate the live power transmission line.

40 Claims, 20 Drawing Sheets

Method 400

U.S. PATENT DOCUMENTS

| | | |
|---|---|---|
| 6,242,895 B1 | 6/2001 | Fujii et al. |
| 6,396,172 B1 | 5/2002 | Couture |
| 6,441,310 B1 | 8/2002 | Niedermier et al. |
| 6,463,212 B1 | 10/2002 | Slayer |
| 6,670,721 B2 | 12/2003 | Lof et al. |
| 6,717,790 B1 | 4/2004 | Morooka |
| 7,002,079 B2 | 2/2006 | Mitchell et al. |
| 7,105,952 B2 | 9/2006 | Divan et al. |
| 7,714,592 B2 | 5/2010 | Radtke et al. |
| 2001/0024374 A1 | 9/2001 | Ben-Yaakov |
| 2003/0051898 A1 | 3/2003 | Maunder et al. |
| 2005/0040809 A1 | 2/2005 | Uber, III et al. |
| 2005/0047044 A1 | 3/2005 | Nolden et al. |
| 2005/0052801 A1 | 3/2005 | Ghali |
| 2006/0081394 A1 | 4/2006 | Li et al. |
| 2007/0114978 A1 | 5/2007 | Lindahl et al. |
| 2008/0061632 A1 | 3/2008 | Couture et al. |
| 2010/0100239 A1* | 4/2010 | Park et al. ................ 700/258 |
| 2010/0155212 A1 | 6/2010 | Mitchell et al. |
| 2011/0012436 A1 | 1/2011 | Hyde et al. |
| 2011/0013323 A1 | 1/2011 | Hyde et al. |
| 2011/0013327 A1 | 1/2011 | Hyde et al. |
| 2011/0101989 A1 | 5/2011 | Hyde et al. |
| 2011/0216463 A1 | 9/2011 | Kester et al. |

FOREIGN PATENT DOCUMENTS

| | | | |
|---|---|---|---|
| JP | 05281286 A | * | 10/1993 |

OTHER PUBLICATIONS

Krishnan et al.; "A Novel Hybrid Heat Sink Using Phase Change Materials for Transient Thermal Management of Electronics"; Jun. 1, 2005; CTRC Research Publications; Paper 66.

Bernstof, A. et al.; "ANSI C29.18 Prototype/CEA LWIWG 02 Design Test Report Silicone Rubber 25 kV Veri*Lite Line Post 80S025"; Report No. EU1529-H; Dec. 19, 2005; printed on Feb. 8, 2012; pp. 1-22; located at: http://www.hubbellpowersystems.com/resources/test-reports/EU1529-H.pdf.

PCT International Search Report; International App. No.: PCT/US11/01712; Feb. 37, 2012; pp. 1-2.

* cited by examiner

Method 400

FIG. 7

Method 700

710
Arranging a measurement device in sensing contact with an insulator in use to electrically isolate a power transmission line. The measurement device is at least partly disposed within the insulator.

720
Measure properties of the in-service insulator with the measuring device.

730
Estimating a standoff voltage capability and/or a time-to-failure based on insulator properties measured by the measurement device and generate a maintenance schedule for the insulator in use.

Power Delivery System

1300A

1300B

Method 1350

FIG. 14B

METHOD
1400B

---
1452
Sense a power line condition or parameter

---
1454
in response, operate a reactive circuit deployed in series with the at least one insulator element

FIG. 15

METHOD
1500

1552
Sense a power line condition or parameter 1554
in response, operate a reactive circuit deployed in series with the at least one insulator element

SYSTEMS AND METHODS FOR ASSESSING STANDOFF CAPABILITIES OF IN-SERVICE POWER LINE INSULATORS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

RELATED APPLICATIONS

1. For purposes of the USPTO extra-statutory requirements, the present application constitutes a continuation-in-part of U.S. patent application Ser. No. 12/460,445, entitled SMART LINK COUPLED TO POWER LINE, naming Roderick A. Hyde, William Gates, Jordin T. Kare, Nathan P. Myhrvold, Clarence T. Tegreene, David B. Tuckerman and Lowell L. Wood, Jr. as inventors, filed on Jul. 17, 2009, which is currently co-pending, or is an application of which a currently co-pending application entitled to the benefit of the filing date.

2. For purposes of the USPTO extra-statutory requirements, the present application constitutes a continuation-in-part of U.S. patent application Ser. No. 12/460,452, entitled MAINTAINING INSULATORS IN POWER TRANSMISSION SYSTEMS, naming Roderick A. Hyde, Muriel Y. Ishikawa, Jordin T. Kare, David B. Tuckerman, Lowell L. Wood, Jr. and Victoria Y. H. Wood as inventors, filed on Jul. 17, 2009, which is currently co-pending, or is an application of which a currently co-pending application entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

BACKGROUND

Power utilities generate electrical power at remote plants and deliver electricity to residential, business or industrial customers via transmission networks and distribution grids. The power utilities may transmit large quantities of electric power over long distance transmission networks from power generating plants to regional substations, which then supply the power to local customers using the distribution grids.

The transmission networks and/or distribution grids may include overhead power transmission lines suspended by towers or poles. The transmission lines may, for example, be bare wire conductors made of aluminum. Instead of aluminum, copper wires may be used in medium-voltage distribution and low-voltage connections to customer premises.

Power loss in transmission lines (in particular, in long distance transmission lines) is a significant component of the cost of electricity. This power loss is a decreasing function of transmission voltage. Therefore, power is typically first transmitted as high voltage transmissions from the remote power plants to geographically diverse substations. The most common transmission voltages in use are 765, 500, 400, 220 kV, etc. Transmission voltages higher than 800 kV are also in use. From the substations, the received power is sent using cables or "feeders" to local transformers that further reduce the voltage. Voltages below 69 kV are termed subtransmission or distribution voltages. The outputs of the transformers are connected to a local low voltage power distribution grid that can be tapped directly by the customers.

The conductors in overhead power transmission lines are supported by or suspended from insulators (e.g., by pin-type and suspension-type insulators, respectively). For subtransmission or distribution voltages, both types of insulators are commonly used in overhead power transmission lines. However, for transmission voltages, only suspension-type insulators are commonly used in overhead power transmission lines.

The mechanical and electrical qualities of the insulators in use directly affect the integrity of a suspended or supported overhead transmission line. Insulators can fail, for example, because of surface contamination, aging, manufacturing defects and damage due to mishandling. Insulator failures are associated with a majority of line outages and most of line maintenance costs.

In practice, commercial electricity transmission networks and distribution grids (collectively "the network" or "the grid") may have complex topologies interconnecting several power plants, regional substations, and load centers. The grid may include multiple redundant lines between network points or nodes so that power can be routed from any power plant to any load center, through a variety of routes, based, for example, on network conditions, power quality, transmission path economics and power cost. Grid operators may control operation of the grid by managing generators, switches, circuit breakers, relays, and loads. Industrial control system techniques may be used for this purpose. For example, the grid may be coupled to common centralized, distributed or networked control systems (e.g., Supervisory control and data acquisition systems (SCADA)), which electronically monitor and control most or the entire grid. The electronic control actions may be performed automatically by remote terminal units ("RTUs") or by programmable logic controllers ("PLCs"). Communication in the control systems between different control elements and grid components may use microwaves, power line communication, wireless, and/or optical fibers.

"Smart" grids may further use modern digital technologies (e.g., automation, sensing and measuring, and communication technologies) to upgrade distribution and long distance transmission grids. The digital technologies may allow grid operations to be improved for increased power quality, reliability, efficiency, uptime, and safety. The digital technologies may allow various distributed power generation and grid energy storage options to be included in the grid, and reduce grid failures (e.g., power grid cascading failures).

Consideration is now being given to improving electricity grids. In particular, consideration is now being given to solutions for keeping insulators, which are in use in overhead power transmission systems, healthy. Some such solutions may prevent insulator failure and reduce line outages and/or line maintenance costs. Further, consideration is being given to improvements directed to alternate or non-traditional grid components for flexible management of grid operations.

SUMMARY

Approaches to maintaining power line insulators in a healthy state are provided.

In an exemplary approach, a "self-conditioning" electrical insulator, which is configured to isolate a high-voltage power transmission line, includes an insulator body having a surface, a sensing unit arranged to detect a state of the surface, and a conditioner arranged to recondition the surface in response to the detected state of the surface. The conditioner may be arranged to apply a coating (e.g., a resistive or hydrophobic coating) to at least a portion of the surface in response to the detected state of the surface. The insulator may include one or more sheds each having an upper surface and a lower surface. The conditioner may be arranged to coat at least a portion of the upper surface and/or lower surface of the at least one shed in response to the detected state of the surface. The coating which may be resistive and/or hydrophobic may for example, include one or more of a hydrocarbon, silicone grease, a fluorocarbon and/or perfluoroheptane. An internal or external source of the coating materials may be suitably coupled to the conditioner. The conditioner may spread the surface coating material over the insulator surface, for example, by lateral flow or extrude the surface coating material through the one or more pores on to at least a portion of the surface.

The conditioner may be configured to apply the surface coating materials after the insulator surface has been cleaned manually or by some other device. However, conditioner itself may be configured to clean at least a portion of the surface by applying, for example, heat, electrical current, ultrasound energy, or a surface cleaning material to the surface. The conditioner may be arranged to spread the surface cleaning material over the surface by lateral flow or by extrusion through one or more pores onto the surface.

The sensing unit coupled to the insulator may be configured to detect surface properties (e.g., surface wetness, dirt, resistivity, and/or leakage currents), weather events (e.g., precipitation, lightning, and/or pollution affecting the surface), and/or line events (e.g., over-voltages and/or faults). The unit also may be configured to detect a time interval since a surface coating and/or a surface cleaning event, and to determine surface coating and/or cleaning times according to a schedule and/or user commands.

In another exemplary approach, a measurement device is arranged to measure properties of an insulator in use to isolate the power transmission line. The measurement device may be physically incorporated in or coupled to the insulator in use. The measurement device may be configured to conduct tests and measure insulator properties or parameters under live wire conditions. The measurement data may be acquired during short time intervals near voltage zero crossings in the power transmission line. During such time intervals, the insulator may be expected to be effectively decoupled from power flow in the power transmission line and the measured data considered to be representative of the individual insulator by itself.

The measurement data may be analyzed by a processing circuit to estimate present-time and predict future voltage standoff capabilities of the insulators in use.

In additional or alternative approaches, devices and methods for delivering high voltage electrical power are provided.

In an exemplary approach, a smart link is provided for use in a power delivery system. The smart link is configured to automatically isolate or insulate a power line, conduct, and or phase shift power on the line.

In another exemplary approach, an assembly includes a power-line insulator and a device disposed in parallel. The assembly further includes a switch configured to establish a conducting path through the device bypassing the power-line insulator. At least a portion of the device and/or the switch may be co-disposed with the power-line insulator in a common physical structure. The device may be an active impedance module, a grounding switch, a lightning arrestor, a surge arrestor, an active grounding device, a dynamically insertable current limiter, an inverter, a transformerless reactive compensation device, a phase angle regulator, a variable series capacitor, a static VAR compensator, a varistor, a Zener diode, a nonlinear resistor, and/or a braking resistor. The device may be configured to inject power, sink power, and/or introduce impedance compensation in a power line and/or insulator path in response, for example, to dynamic loading, transient voltages and/or currents, phase conditions or other conditions on the power line.

In yet another exemplary approach, a device includes an insulator configured to electrically isolate a power line, and a switchable conductance coupled to insulator and placed in parallel with the insulator. At least a portion of the switchable conductance may be disposed within the insulator. The switchable conductance may include one or more of a resistive device, resistor, varistor, a reactive element, an active impedance module, a grounding switch, a lightning arrestor, a surge arrestor, an active grounding device, a dynamically insertable current limiter, an inverter, a transformerless reactive compensation device, a phase angle regulator, a variable series capacitor, a static VAR compensator, a braking resistor, and/ or other circuit elements.

The switchable conductance may be configured to divert a current around the insulator in response, for example, to a breakdown and/or an anticipated breakdown of the insulator, a rise and/or a predicted rise in voltage across the insulator, and/or measured power line parameter values, an environmental event and/or predicted environmental event proximate and/or remote to the device. The switchable conductance may be coupled to a heat sink made of materials that absorb heat by phase change.

In a further exemplary approach, a method includes deploying an insulator assembly having two switchable states—an insulator state and a parallel device state, to electrically isolate a power line, sensing a power line condition or parameter, and in response, switching the insulator assembly to its parallel device state to source, sink, and/or dispatch real and/or reactive power on the power line.

In yet another exemplary approach, a method includes disposing a power-line insulator and a device in parallel, and providing a switch configured to establish a conducting path through the device bypassing the power-line insulator. The switch may be actively switchable in response to a power line condition or parameter. The device, which may be directly or indirectly coupled to a power line, may carry real and/or reactive currents in its active state. The device may be configured to inject power into and/or sink power from a power line, introduce compensation in a power line and/or insulator path to control current values, and/or regulate an equivalent reactance of a power line and/or suppress power oscillations in the power line.

In still another exemplary approach, a method includes providing an insulator to electrically isolate a power line, and providing a switchable parallel conductance coupled to insulator. The switchable conductance may include a resistive device, a resistor and/or varistor, an active impedance module, a grounding switch, a lightning arrestor, a surge arrestor, an active grounding method, a dynamically insertable current limiter, an inverter, a transformerless reactive compensation method, a phase angle regulator, a variable series capacitor, a static VAR compensator, a varistor, a Zener diode, a nonlinear resistor, and/or a braking resistor. The method further includes switching the switchable conductance on or closed in an active state and diverting a current around the insulator. Heat generated by the current flow may be absorbed by a heat sink made of material that absorbs heat by phase change.

BRIEF DESCRIPTION OF THE FIGURES

In the accompanying drawings:

FIG. 1C shows exemplary power transmission lines, in accordance with the principles of the solutions described herein;

FIG. 7 is a flow diagram illustrating an exemplary method for assessing insulator standoff capabilities, in accordance with the principles of the solutions described herein;

FIG. 14B is a flow diagram illustrating an exemplary method for operating a power delivery system which uses insulator element/reactive circuit combinations to electrically isolate a high voltage power transmission line, in accordance with the principles of the solutions described herein; and FIG. 15 is a flow diagram illustrating an exemplary method for dispatching power over a multi-line power delivery system, in accordance with the principles of the solutions described herein.

Throughout the figures, unless otherwise stated, the same reference numerals and characters are used to denote like features, elements, components, or portions of the illustrated embodiments.

DESCRIPTION

In the following description of exemplary embodiments, reference is made to the accompanying drawings, which form a part hereof. It will be understood that embodiments described herein are exemplary, but are not meant to be limiting. Further, it will be appreciated that the solutions described herein can be practiced or implemented by other than the described embodiments. Modified embodiments or alternate embodiments may be utilized, in the spirit and scope of the solutions described herein.

Figure 1A:
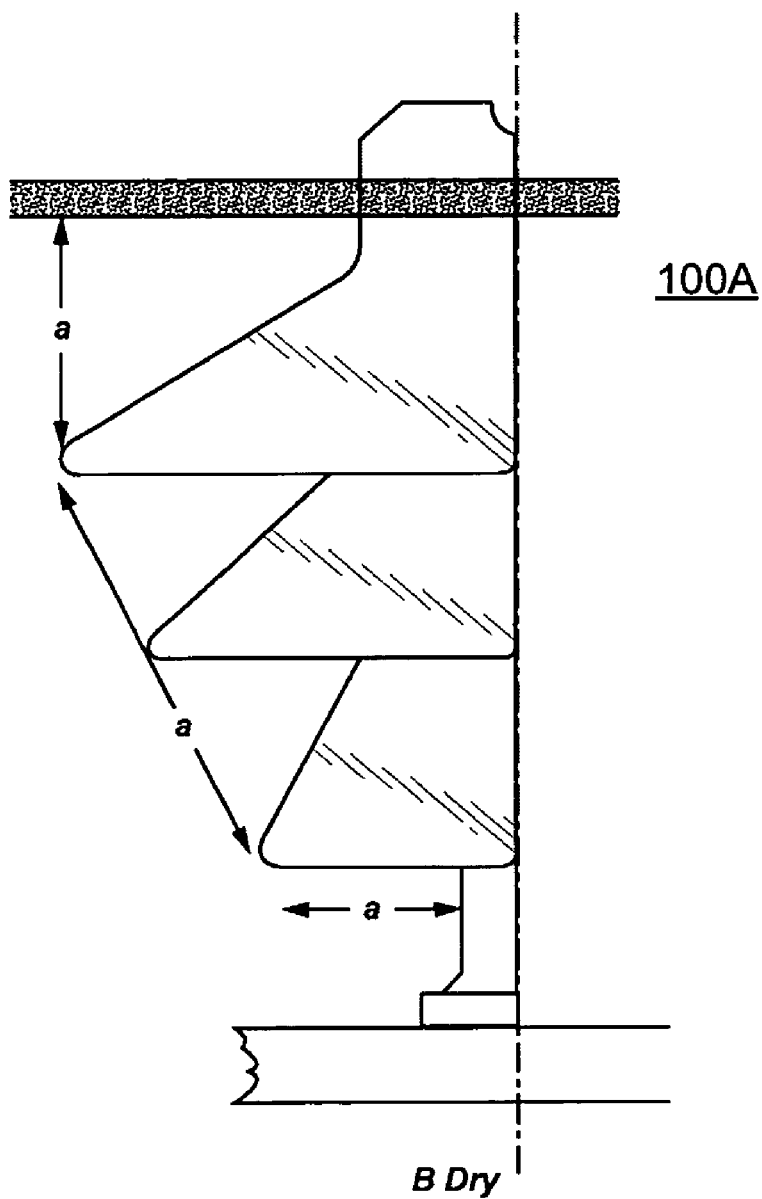
FIGS. 1A and 1B are illustrations of exemplary pin-type and suspension-type insulators.
Figure 1B:
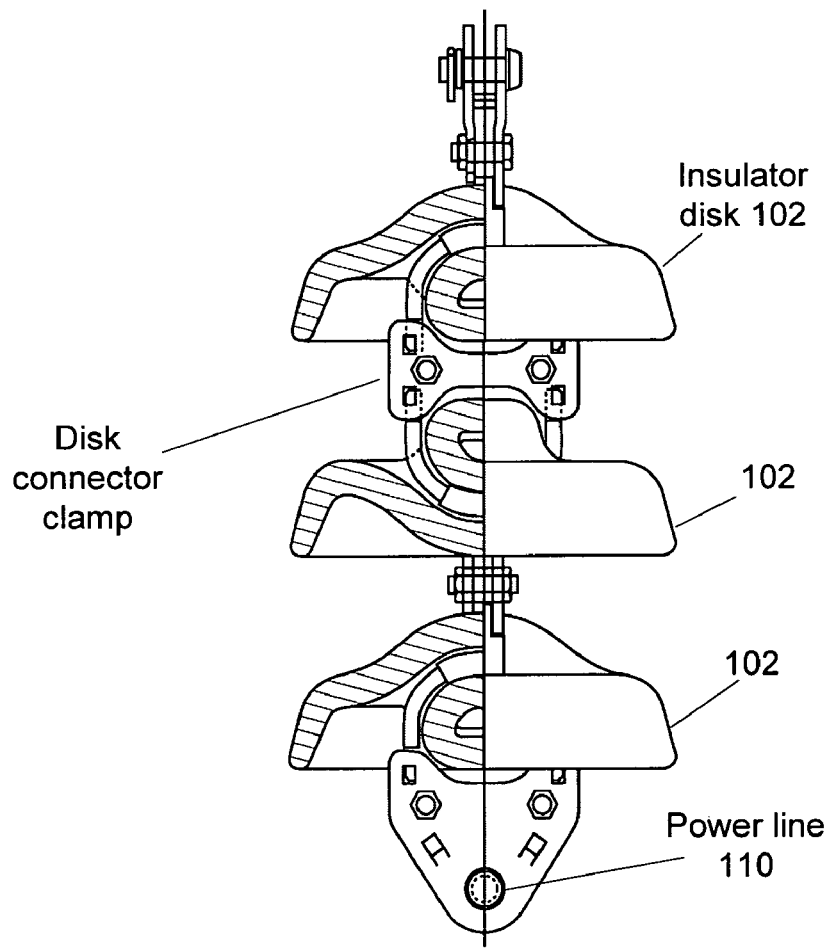

FIGS. 1A and 1B show exemplary pin-type and suspension type insulators 100A and 100B, respectively, which may be deployed in an overhead power transmission line. The insulators may be made, for example, from wet-process porcelain, toughened glass, glass-reinforced polymer composites or other non-ceramic materials. Porcelain insulators may have a semi-conductive glaze finish, so that a small current (a few milliamperes) passes through the insulator. This warms the surface slightly and reduces the effect of fog and dirt accumulation. The semiconducting glaze also insures a more even distribution of voltage along the length of the chain of insulator units 102.

Figure 1C:
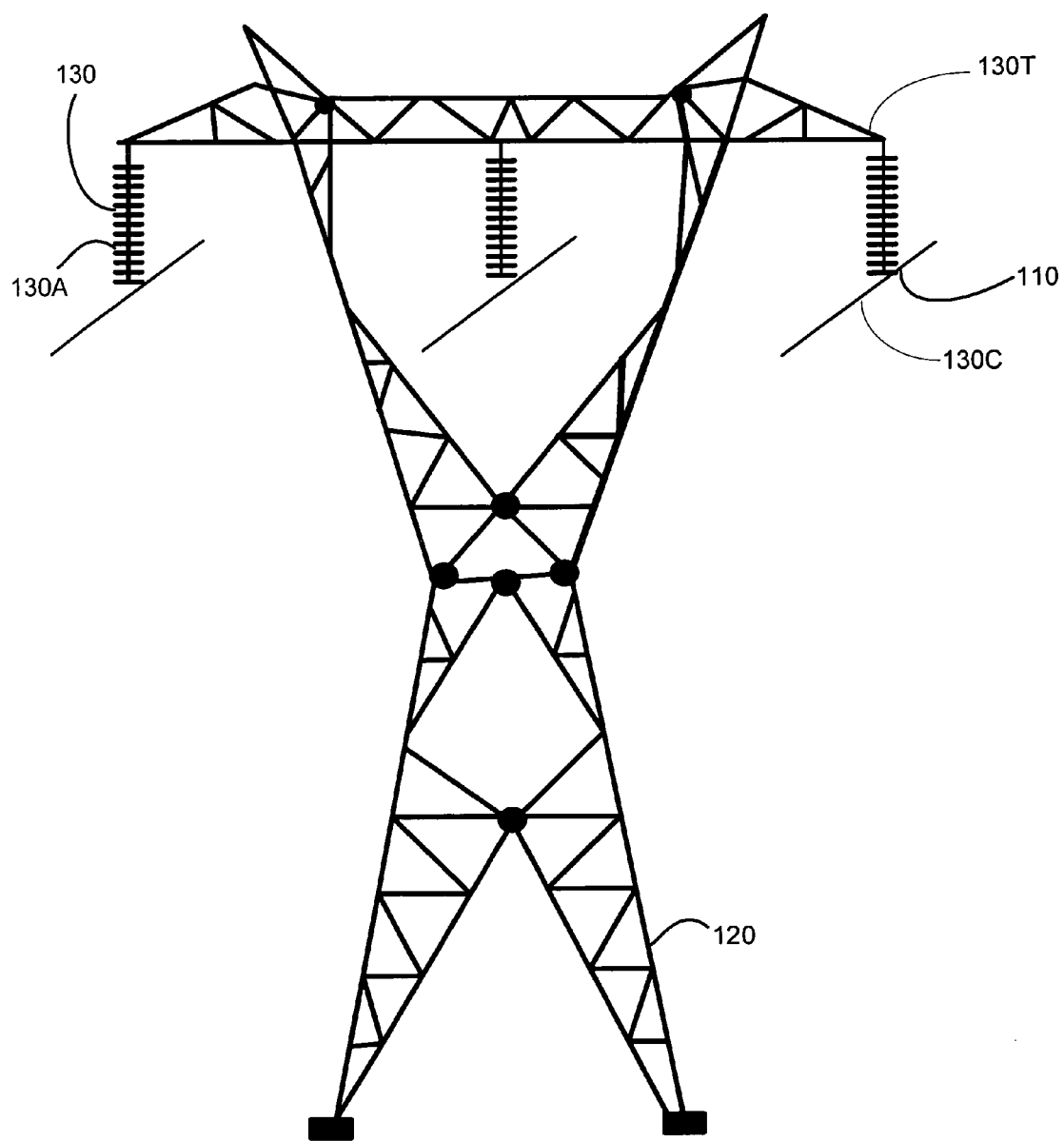
FIG. 1C is an illustration of an exemplary power transmission tower from which power lines are supported by suspension-type insulators.

FIG. 1C shows exemplary power transmission lines 110 supported from a tower 120 by suspension type insulators 130. Insulators 130 may be made of one or more insulator disks 130A. The number of disks 130A in any particular insulator 130 deployed to support lines 110 from tower 120 may be selected in consideration of the line voltages, lightning withstand requirements, altitude, and environmental factors such as fog, pollution, or salt spray. The number of disks may be increased to obtain longer insulators 130 having longer creepage distance for leakage currents along insulator surfaces. Further, insulators 130 may be selected to be strong enough to mechanically support the weight of the supported line, as well as loads due to ice accumulation, and wind.

Approaches for avoiding line outages and/or reducing line maintenance costs include keeping line insulators in a healthy state even as they are in service under energized, live or hot line conditions.

In an exemplary approach for avoiding line outages and/or reducing line maintenance costs, a power transmission line system includes a mechanism for automatically reconditioning insulator surfaces to mitigate the deleterious effects of fog, salt spray, pollution and/or dirt accumulation on insulator performance or lifetime. The system may include one or more electrical insulators arranged to electrically isolate a power line, and an insulator surface conditioner arranged to recondition the surface of an electrical insulator in use (i.e., under live wire conditions). The conditioner may be arranged to clean and/or apply a coating (e.g., a resistive and/or hydrophobic coating) to the surface. The coating may, for example, be any suitable current-impeding coating. The coating materials (e.g., a hydrocarbon, silicone grease, a fluorocarbon and/or perfluoroheptane) may be obtained from a source or reservoir coupled to the conditioner. Likewise, cleaning materials (e.g., detergents, solvents, surfactants, etc.) may be obtained from a source or reservoir coupled to the conditioner. The sources may be configured to deliver the coating materials and cleaning materials over the surface by lateral flow or by extrusion through pores or openings in the insulator surface.

Instead or in addition to applying cleaning fluids, the conditioner may be arranged to apply heat, electrical current, ultrasound or other forms of energy to clean or recondition the insulator surfaces. The surface cleaning energy may be applied in conjunction with application of cleaning fluids and/or coating materials. The system may further include a component for collecting and/or disposing reconditioning process residues.

The conditioner may recondition the surface of the electrical insulator on user command, on a suitable time schedule or in response to a detected insulator surface condition or line event. For this purpose the system may include a sensing unit arranged to detect a state of the insulator surface (e.g., surface wetness, dirt, resistivity, and/or leakage currents), line events (e.g., line faults and over voltages) and/or environmental conditions (e.g., precipitation, lightning, and/or pollution affecting the surface). Further, the system may include a timer configured, for example, to detect a time interval since a previous surface coating and/or a surface cleaning event. The sensing unit also may be configured to report system status including for example, conditioner status, and information on one or more of present surface conditions, pre- and post-reconditioning event surface conditions, and the timing and completion of reconditioning events.

Figure 2:
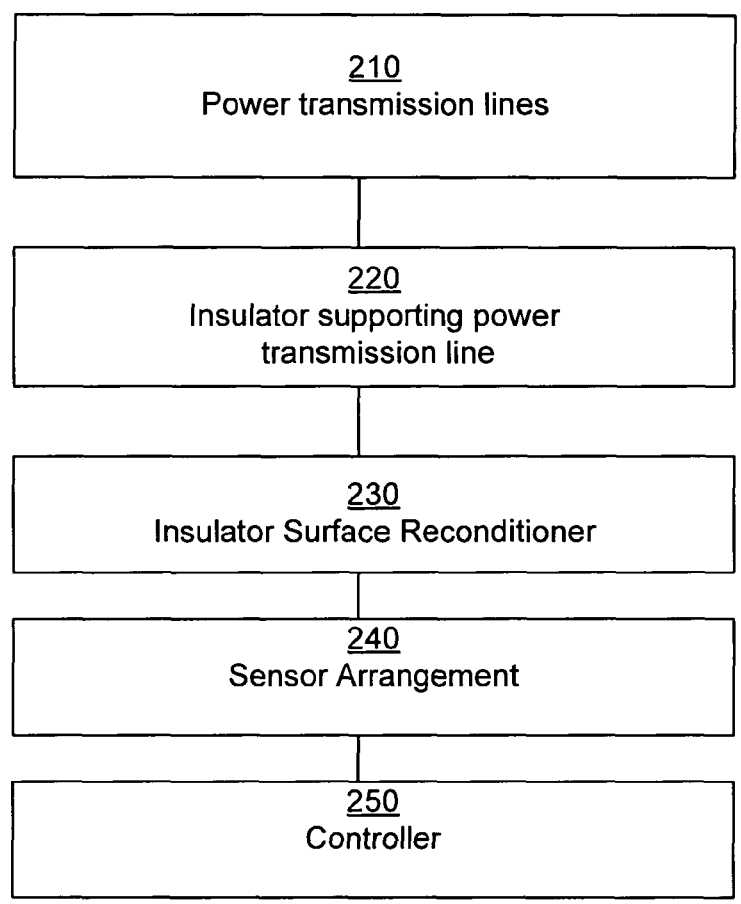
FIG. 2 is a block diagram illustrating components of an exemplary power transmission line system, in accordance with the principles of the solutions described herein.

FIG. 2 shows an exemplary power transmission line system 200 having "self-reconditioning" insulators. System 200 includes power transmission lines 210 supported by insulators 220, which are coupled to an insulator surface reconditioner 230. System 200 may include a controller 250 configured to coordinate operation of surface reconditioner 230 to keep the surfaces in good insulating condition. System 200 may also include a sensor arrangement 240 configured to monitor insulator, line conditions and/or weather conditions. Sensor arrangement 240 may generate appropriate reporting signals to controller 250, surface reconditioner 230 and/or other external devices.

Surface reconditioner 230 may be configured to prime or clean the insulator surfaces by treating the surfaces with suitable priming or cleaning materials and/or energy. For example, surface reconditioner 230 may clean insulator surface portions by controllably applying cleaning or washing fluids to the surface portions. The cleaning or washing fluids may include chemical and/or physical cleaning agents (e.g., chemical solutions or gels, detergents, surfactants, compressed gasses etc.). The cleaning fluids may be naturally deposited rain water. A flow of fluids across an insulator surface portion may be driven by surface tension. An insulator surface portion may be structured to create a surface energy gradient so that flow of cleaning or washing fluids (and other fluids/coating materials) over the portion of the surface is driven by the surface energy gradient.

Additionally or alternatively, surface reconditioner 230 may clean insulator surface portions by controllably applying heat (e.g., resistive heat) and/or radiation (e.g., UV, ultrasound, light) to the surface portions. Alternatively or additionally, surface reconditioner 230 may resurface the insulator surfaces or portions thereof with an insulating, resistive or other protective coating material (e.g., a silicone grease, fluorocarbons, pefluoroheptane, etc.). The coating may be applied with or without previous priming or cleaning of the insulator surfaces. Further, the previous priming or cleaning of the insulator surfaces may be implemented manually or using other devices independently of system 200.

Sensor arrangement 240 may include suitable sensors to detect, for example, conductive or dirty regions of the insulator surfaces, weather-related events (e.g., snow, ice or rain) and/or line events (after over-voltages, faults, etc.). Sensor arrangement 240 may include one or more of optical, chemical, electrical and/or mechanical sensors. Sensor arrangement 240 may also be configured to report a cleanliness status of the insulator, for example, to controller 250 and/or other external devices. Further, sensor arrangement 240 may be configured to measure a physical and/or electrical status of coating materials present on the insulator surfaces, and to report such status to other components of system 200 or other external devices.

In response to suitable sensor signals and/or external commands, surface reconditioner 230 may clean and/or resurface the insulator surfaces. Surface reconditioner 230 may clean and/or resurface all insulator surfaces or only limited portions (e.g., dirty or conductive portions) thereof. Surface reconditioner 230 may clean and/or resurface the insulator surfaces on a time schedule or in a continuous mode.

One or more components of surface reconditioner 230 (e.g., fluid reservoirs, pumps, etc.) in system 200 may be placed in or about the insulator body (e.g., in physical cavities or portions of the insulator body). Alternatively or additionally, one or more components of surface reconditioner 230 may be placed in operational proximity to the insulator body (e.g., on tower 120). Likewise, one or more components of controller 250 and sensor arrangement 240 may be disposed in or about the insulator body or at other locations.

Controller 250 may be configured to supervise operation of system 200 including surface reconditioner 230. Controller 250 may have any suitable mechanical or electromechanical structure, and include an optional programmable interface. In operation, controller 250 may control timing and extent of reconditioning processes performed by surface reconditioner 230. For example, controller 250 may control the amounts of coating and/or cleaning fluids released by surface reconditioner 230 in response to one or more event-triggered control signals. The event-triggered control signals may be generated by one or more control elements. The control elements may include sensors of sensing arrangement 240, a timer and/or a user-activated switch (not shown). Like the components of surface reconditioner 230 and sensing arrangement 240, control elements and other components of controller 250 may be disposed either inside or outside the insulator body. One or more controller 250 components may, for example, be located in a remote building or facility, for example, and linked through wireless, wired, IP protocol or other approaches.

Figure 3:
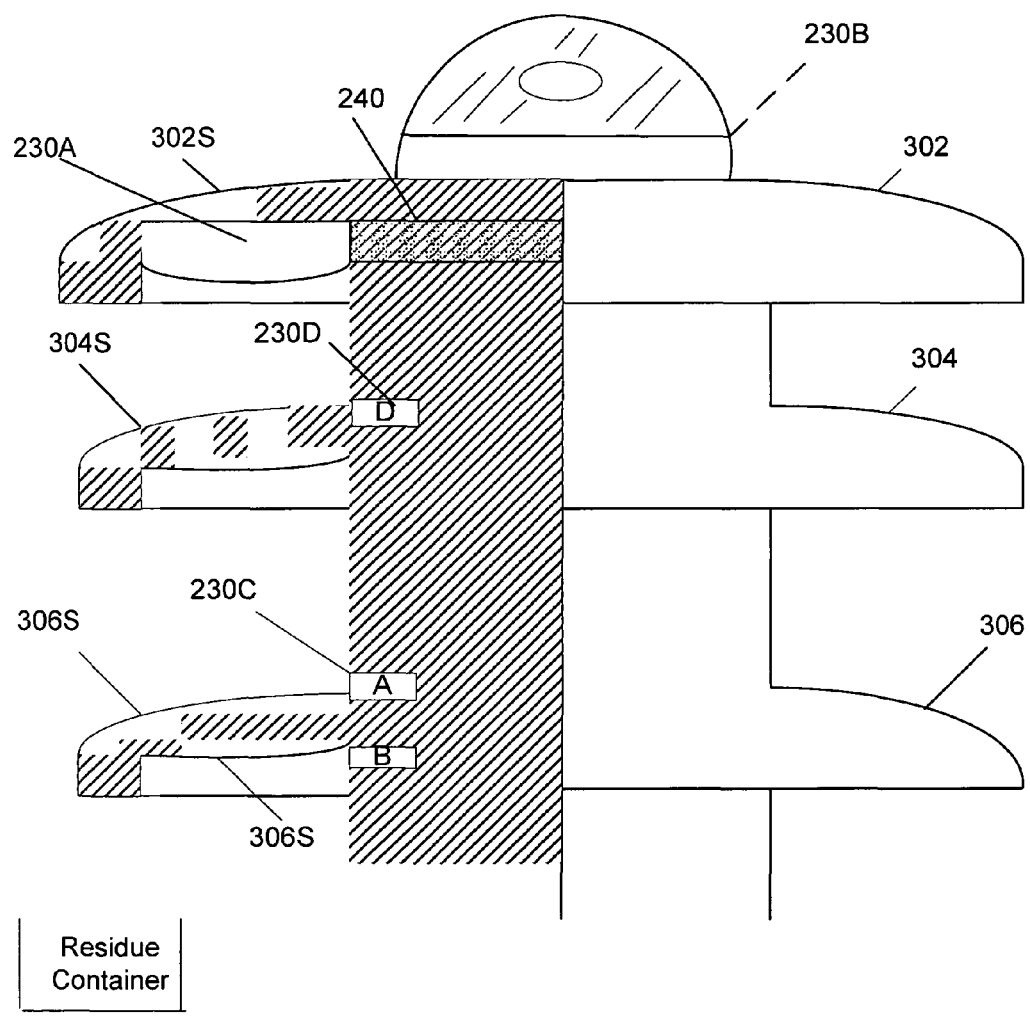
FIG. 3 is a schematic illustration of an exemplary power line insulator having self-reconditioning features, in accordance with the principles of the solutions described herein.

FIG. 3 shows an exemplary insulator 300 having three insulator disks or sheds 302-306. Insulator 300 includes surface reconditioner components 230A-230D and sensor 240 incorporated in portions of the insulator body.

Component 230A may, for example, be an energy-emitting device (e.g., UV, or infrared device) placed underneath insulator shed 302. Component 230A may be configured to illuminate top surface 304S of underlying insulator shed 304 with surface cleaning energy. The surface cleaning energy may remove or reduce pollutant accumulations or deposits on surface 304S by, for example, thermal, ultrasonic, or photochemical action. Component 230B may, for example, be a pressurized reservoir or source of silicone grease and/or cleaning fluids. Component 230B may be disposed above shed 302 to release the silicone grease and/or cleaning fluids through openings (not shown) on to top surface 302S. Further, component 230C disposed, for example, in shed 304 may, include a pair of electrodes A and B. Component 230C may be configured to remove or reduce pollutant accumulations or deposits on outer surfaces 306S of shed 306 electrically by passing a surface current between electrodes A and B. Component 230D may, for example, be an ultrasound energy-emitting device. Component 230D may be configured to remove or reduce pollutant accumulations or deposits on surface 304S by ultrasonic action.

In general surface reconditioner 230 may be configured to apply the cleaning and coating materials by extruding the materials either over a broad area of an insulator surface or a limited area. The materials may be supplied from either internal or external reservoirs/sources. In an exemplary embodiment, a flow of the materials across an insulator surface portion may be driven by surface tension. An insulator surface portion may be structured to create a surface energy gradient so that flow of the materials over the portion of the surface is driven by the surface energy gradient.

One or more components 230A-D of surface reconditioner 230 may be arranged to operate in open-loop configurations. Alternatively, one or more components 230A-D of surface reconditioner 230 may be configured to operate in closed-loop configurations in conjunction with, for example, a feedback sensor signal generated by sensor arrangement 240. Surface reconditioner 230 may resurface insulator surfaces in response to a sensed surface state (wetness, dirt, cleanliness, resistivity, leakage currents, etc.), environmental conditions (e.g., precipitation, lightning, pollution, etc.), line events (over-voltages, faults, etc.).

The resurfacing of the insulator surfaces (e.g., cleaning, priming and/or recoating) by surface reconditioner 230 may extend over the full surface or be limited to a region of the surface. Regional resurfacing may be based on local surface conditions, or upon a schedule. The resurfacing materials and/or energy may be applied uniformly to the surface region (e.g., via extrusion through a porous surface) or may result from lateral flow of fluids from localized sources/reservoirs at an edge of the surface region.

Surface reconditioner 230 may be configured to remove existing insulator surface coatings. Surface reconditioner 230 may remove the existing coatings using suitable cleaning fluids, heat, ultrasonic energy, and/or suitable photo-driven breakdown. System 200/surface reconditioner 230 may be further configured to collect the removed old coating material (e.g., by gravity flow, in the case of fluid removed coatings). The old coating materials may be discarded, kept for analysis, or recycled.

Components and subcomponents of surface reconditioner 230, sensor arrangement 240, and other internal or external devices (e.g., controller 250, status indicators etc.) may be interconnected using any suitable approaches including, for example, optical, electrical, pneumatic, and/or mechanical approaches.

Figure 4:
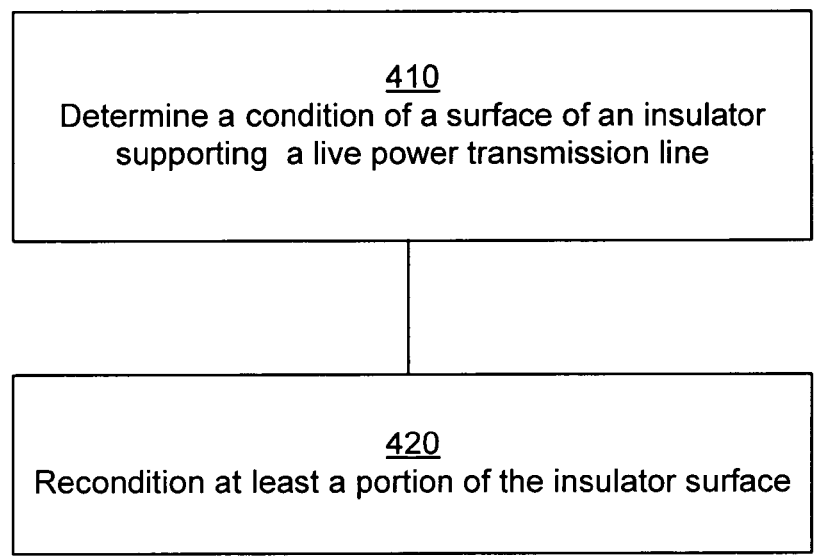
FIG. 4 is a flow diagram illustrating an exemplary method for maintaining power line insulators in a healthy state, in accordance with the principles of the solutions described herein.

FIG. 4 shows exemplary features of a method 400 for maintaining in-service power transmission line insulators in a healthy state. Method 400 involves reconditioning insulator surfaces under live wire conditions. Method 400 includes determining a condition of a surface of an insulator supporting a live power transmission line (410), and accordingly reconditioning at least a portion of the insulator surface (420) to maintain the in-service insulator in a healthy state.

Reconditioning the insulator surface may involve applying a coating (e.g., a resistive, hydrophobic or other protective coating) to at least a portion of the surface. The coating materials may include one or more of a hydrocarbon, silicone grease, a fluorocarbon and/or perfluoroheptane. Method 400 includes obtaining such coating materials from sources coupled to the electrical insulator, and laterally flowing the coating materials over at least a portion of the surface or extruding the coating materials though the one or more pores on to at least a portion of the surface. Additionally or alternatively, reconditioning the insulator surface may involve cleaning or priming the insulator surface. In method 400, cleaning or priming the insulator surface may include applying heat, an electrical current, ultrasound energy other energy and/or a surface cleaning material from a source coupled to the electrical insulator. Like the coating materials, the surface cleaner materials may be laterally flowed and/or extruded through the pores onto at least a portion of the surface.

In method 400, the surface reconditioning processes (e.g., coating, cleaning or priming operations) are carried out automatically in response to a determined state of a surface of an insulator supporting a live power transmission line (410). Method 400 may include physically collecting and/or disposing reconditioning process residues. Further, determining a state of a surface of an electrical insulator may include detecting one or more of surface conditions (e.g., surface wetness, dirt, resistivity, and/or leakage currents), environmental or weather conditions (e.g., precipitation, lightning, and/or pollution affecting the surface) and/or line events (e.g., over-voltages or line faults). Additionally or alternatively, determining a state of a surface may include detecting a time interval since a previous surface reconditioning event, determining a surface coating and/or cleaning time according to a schedule and/or a user initiated command signal.

Further, method 400 may include reporting surface conditions before and/or a reconditioning event, reporting information on one or more of current surface conditions, timing and completion of reconditioning events.

In another exemplary approach for avoiding unplanned line outages and/or reducing line maintenance costs, a power transmission line system includes capabilities for assessing changes in the standoff capability of in-service insulators. The results of such monitoring may help establish maintenance and insulator replacement schedules to reduce unplanned outages and line maintenance costs.

Voluntary industry standards have been established for testing and qualifying insulators for use in power transmission systems. For example, Institute of Electrical and Electronic Engineers standard: "IEEE 1024-1988" recommends practice for distribution suspension type composite insulators made from a core, weathersheds, and metal end fittings that are used in the distribution of electric energy. The recommendation contains several design tests that are unique to composite insulators. Further, for example, American National Standards Institute (ANSI) standard: "ANSI C29.11 Composite Suspension Insulators for Overhead Transmission Lines—Tests", describes tests and acceptance criteria for composite insulators for applications above 70 kV. Other ANSI standards in the C29 series are for insulators made of wet-process porcelain or toughened glass. Further, for example, International Electrotechnical Commission (IEC) standard: "IEC 1109: Composite insulators for a.c. overhead lines with a nominal voltage greater than 1000 V—Definitions, test methods and acceptance criteria," describes tests and acceptance criteria for composite insulators for applications above 1 kV. Other IEC standards (e.g., IEC 383, IEC 437: Report—radio interference test on high-voltage insulators, IEC 507: Report—artificial pollution tests on high-voltage insulators to be used on a.c. systems, IEC 60060-1 and IEC 60060-2, etc.) set forth test and acceptance criteria for other insulator types and use conditions. All of the aforementioned industry standards are incorporated by reference in their entireties herein.

The voluntary industry standard tests and characteristics are intended to give a common base to designers, users and suppliers of overhead lines, insulators and line equipment when definition, evaluation or verification of the electrical characteristics of such equipment is required.

The voluntary industry standard tests and characteristics relate to power line insulators under defined test conditions before the insulators are deployed in power transmission systems. However, insulators can degrade or deteriorate in use. An insulator may develop impurities, cracks or other defects which limit its ability to withstand electrical potential. Degrading influences may include contamination of insulator surfaces with chemicals from the surrounding atmosphere that attack and destroy the molecular structure, and physical damage due to improper handling or accidental shock, vibration and excessive heat. Further, voltage transients in the conductors inside the insulators that are caused, for example, by power surges or spikes can lower the dielectric strength to the point of failure. The degrading influences may result in more leakage current through the insulator, which may be indicative of impending insulator failure.

In the exemplary monitoring approach, standoff capability measurement devices, probes and sensors (collectively "measurement devices") are physically integrated with insulator bodies and/or place in close proximity thereto. The measurement devices may be configured to test, measure, or monitor selected insulator properties (e.g., surface resistivity/conductivity, leakage currents, electric fields, etc.) that relate to the insulators' standoff capabilities under live conditions. The testing by the measurement devices may include any suitable test or tests of insulator characteristics and properties. The tests may optionally include one or more tests of insulator characteristics that are the same or similar to those described in the voluntary industry standards for insulator testing. The measurement devices may apply zero, low and/or high-frequency test fields/voltages to an insulator or a portion thereof for testing purposes. Further, the measurement devices may be configured to detect environmental events (e.g., rain, snow, lightning, pollution, etc.) and line events (e.g., faults).

A local or remote signal or data processing circuit coupled to the measurement devices may log and/or process measurement device data. The processing circuit may, for example, include algorithms or routines for predicting insulator characteristics and behavior based on the measured insulator properties and/or environmental events. The processing circuit may be configured to report the measured and/or predicted insulator characteristics and behavior to a controller or other user. The processing circuit may be configured to generate reports based on a schedule, and/or in response to a query or event (e.g., a weather event such as rain/snow/lightning, or an insulator characteristic value event).

Figure 5:
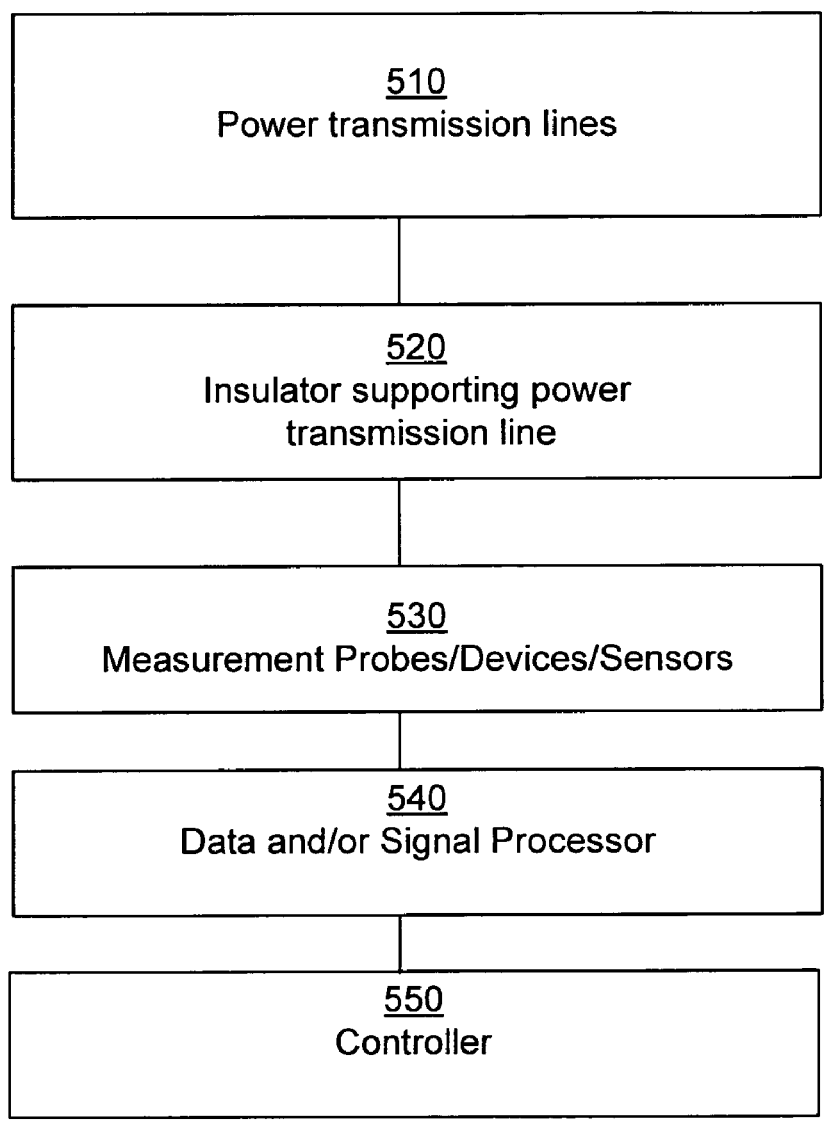
FIG. 5 is a block diagram illustrating components of another exemplary power transmission line system, in accordance with the principles of the solutions described herein.

FIG. 5 shows an exemplary power transmission line system 500 including capabilities for monitoring and predicting insulator standoff capabilities of in-service insulators. System 500 includes power transmission lines 510 supported by insulators 520, which are coupled to measurement devices, probes and sensors ("measurement devices" 530). Measurement devices 530 may be coupled to a signal or data processing circuit 540. Further, system 500 may include a controller 550 configured to coordinate operation of measurement devices 530, processing circuit 540 and other internal and external devices.

Measurement devices 530 may include sensors (e.g., sensor arrangement 240) configured to monitor insulator, line conditions and/or weather conditions or events. Further, measurement devices 530 may include electrical, chemical, mechanical, optical, and/or other types of devices or probes, which are configured to suitably test electrical and mechanical characteristics or properties of in-service insulators in system 500. The devices or probes may include, for example, electronic devices (e.g., ohmmeters, ammeters, voltmeters, magneto-optic devices, opto-electric devices, capacitances, resistors, etc.), mechanical devices (switches, shunts), and/or optical devices (e.g., magneto-optic current transducers, opto-electric imagers, etc.) The measured properties may, for example, include one or more of absorption currents, capacitive charging currents, leakage currents, capacitance, resistance (e.g., single or spot megaohm readings), dielectric absorption (DA), polarization index (PI), high potential or hipot (high voltage) and step voltage responses, switching or lightning impulse voltage responses, and/or temperature.

The measurements by measurement devices 530 may involve application of suitable voltages to the insulator or portions of the insulator. The testing voltages applied to the insulator or portions of the insulator may be DC voltages or AC voltages. The AC voltages may, for example, be at a nominal line frequency or at higher frequencies. For example, dielectric absorption (DA) testing, which is a measure of the ability of the insulator under test to withstand high voltage without breakdown, involves the application of a predetermined value of DC voltage for a period of one minute. The measurement voltages may be derived form suitable power sources internal or external to the insulator. For example, the power sources may be voltage/current transformers coupled to a power line. (See e.g., U.S. Pat. No. 4,823,022, which describes a current transformer and/or a voltage transformer embedded in a power line supporting insulator to form an integral unit therewith.)

One or more measurement devices 530 may be configured to conduct Hipot or over-potential testing, which involves the application of a predetermined AC or DC over-voltage to determine if that voltage can be successfully withstood or if defects exist in the insulator, by applying test voltages to the insulator segment by segment. For example, each insulator disk or shed in a string of insulator disks may be tested one by one. Likewise, step voltage or leakage current vs. voltage testing of the insulator, which involves applying a DC test voltage for a specific amount of time and recording the leakage current at scheduled times (e.g., after 60 seconds) for a series of voltage steps up to a predetermined level of voltage, may be conducted on insulator segment by segment.

Additionally or alternatively, one or more measurement devices 530 may be configured to conduct a resistivity, a breakdown voltage, a voltage response, and/or water penetration tests including hardness, steep-front impulse voltage, and power frequency voltage tests in under appropriate weather conditions (e.g., rain). Further, one or more measurement devices 530 may be configured to conduct low-frequency dry flashover tests, low-frequency wet flashover tests, critical impulse flashover tests, radio-influence voltage and salt fog-like tests. Measurement devices 530 (e.g., imagers) also may be used to optically evaluate insulator surface properties (e.g., discoloration, chalking, crazing, dry bands, tracking and erosion) related to material ageing.

Components and subcomponents of measurement devices 530 may be interconnected to processing circuit 540 and other internal or external devices (e.g., controller 550, status indicators, displays, etc.) using any suitable approaches including optical, electrical, wireless, pneumatic, and/or mechanical approaches. Processing circuit 540 may be configured to receive and process data and/or signals from one or more measurement devices 530 over the interconnections. Processing circuit 540 may include any suitable combination of hardware and software for processing the data and/or signals. Processing circuit 540 may include an algorithm or routine configured to compute a present-time standoff voltage capability of an insulator in system 500. The algorithm may generate a present-time standoff voltage capability based, for example, on live data and/or signals received from measurement devices 530 and/or historical measurement data. Processing circuit 540 may further include a predictive algorithm or routine configured to predict or forecast future standoff voltage capability of the insulator based, for example, on trends or events in historical measurement data. The predictive algorithm may be configured to predict a time to failure estimate for the insulator. The predicted standoff voltage capability and time to failure values may include consideration of factors such as insulator age, and/or weather conditions, etc. Processing circuit 540 may include or have access to lookup tables and formulas for computing values for different conditions.

Processing circuit 540 may be configured to report measurement data and processing results to other devices (e.g., controller 550) and/or users. Processing circuit 540 may be configured to report measurement data and processing results according to a schedule, in response to a query, in response to environmental event, or in response to measured or predicted values crossing preset thresholds.

Optional controller 550 may be configured to supervise operation of system 500 including measurement devices 530 and processing circuit 540. Controller 550 may have any suitable mechanical or electromechanical structure, and include an optional user interface. In operation, controller 550 may control timing and extent of measurements performed by measurement devices 530 and data and/or signal processing by processing circuit 540. For example, controller 550 may initiate measurements by measurement devices 530 in response to one or more event-triggered control signals. The event-triggered control signals may be generated by one or more control elements. The control elements may include sensors in measurement devices 540 or other sensors (e.g., sensor arrangement 240, FIG. 2), a timer and/or a user-activated switch (not shown).

One or more components or portions of system 500 including measuring devices 530, processing circuit 540 and controller 550 may be placed in or about the insulator structure (e.g., in physical cavities or portions of the insulator body). Alternatively or additionally, one or more components or portions of system 500 may be placed in operational proximity to the insulator body (e.g., on tower 120, or on insulator disk connectors) or at remote locations. One or more components of processing circuit 540 and/or controller 550 may, for example, be located in a remote building or facility and linked with system 500 components through wireless, wired, IP protocol or other approaches.

Figure 6:
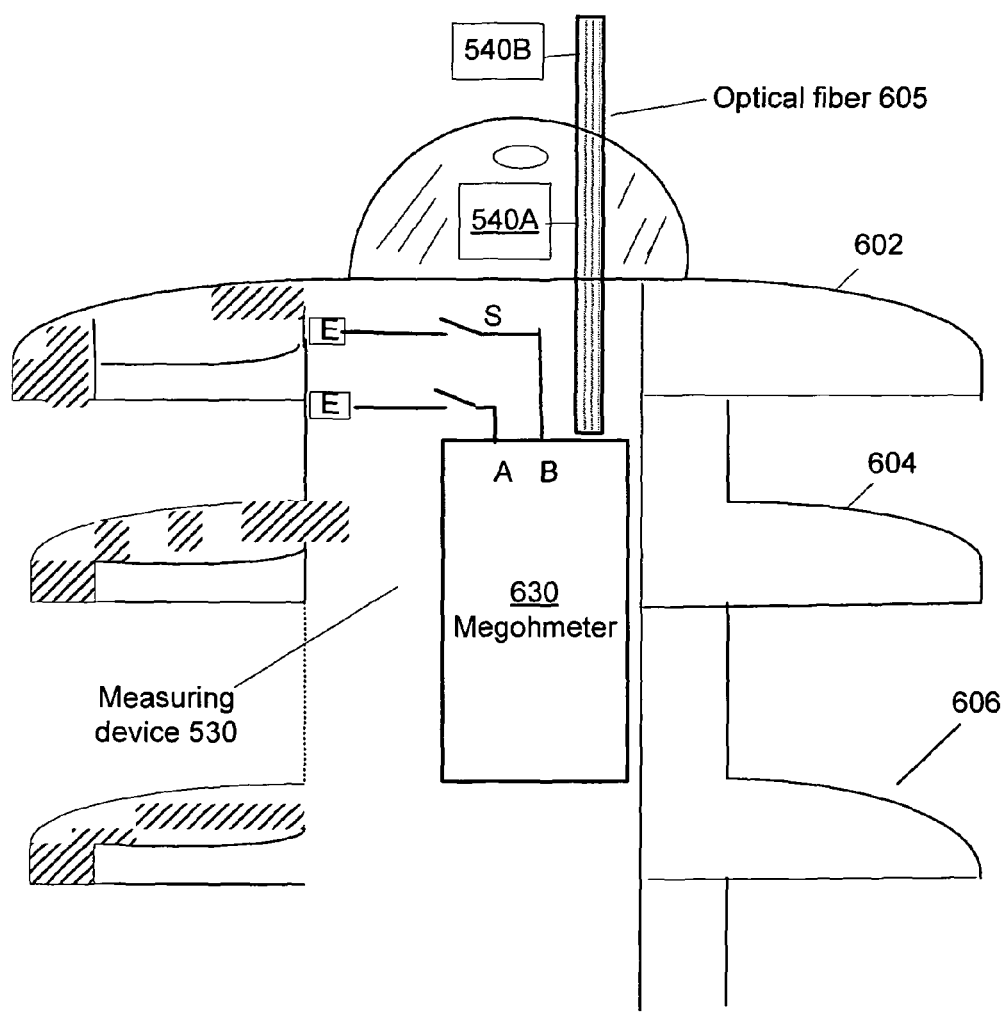
FIG. 6 is a schematic illustration of an exemplary power line insulator coupled to measurement probes for assessing insulator standoff capabilities, in accordance with the principles of the solutions described herein.

FIG. 6 shows an exemplary insulator 600 that may be used in system 500. Insulator 600 may have several insulator disks or sheds (e.g., sheds 602-606) strung together. Insulator 600 includes measuring devices 530 and other structures for assessing, detecting and reporting the standoff capabilities of insulator 600 in service. Measuring devices 530 may be linked to a data and/or signal processing circuit 540A/B and other devices (e.g., controller 550) via wired or wireless electrical, and/or optical links (e.g., via optical fiber 605). Measuring devices 530, processing circuit 540A-B, and the other structures may be physically disposed wholly or in part within the insulator body or at locations external to the insulator body. FIG. 6 shows, for example, measurement devices 530 disposed within insulator 600, processing circuit component 540A disposed on top of insulator 600, and processing circuit component 540B disposed at an external location.

FIG. 6 further shows, for example, measurement devices 530 as including a megohmeter 630, which is configured to be switchably connected across a portion of the insulator body (e.g., shed 602) to measure the portion's resistivity. Megohmeter 630 includes megohmeter probes A and B, which may be configured to be connected to electrodes E on either side of shed 602 by switches S. Switches S may, for example, be mechanical or electronically operable switches, which may operate under the supervision of processing circuit 540A/B and/or controller 550. When insulator 600 is deployed in system 500, megohmeter 630 may, for example, provide resistivity data that can be processed to assess insulator standoff voltage capability in real time and to predict time to failure.

FIG. 7 shows exemplary features of a method 700 for assessing the standoff voltage capabilities of in-service power transmission line insulators. Method 700 includes arranging a measurement device in physical contact with an insulator in use to electrically isolate a power transmission line (710), and measuring properties of the insulator in use with the measurement device (720). At least a part of the measuring device is disposed within the structure or body of the insulator.

In method 700, measuring properties of the insulator in use with the measurement device may include measuring one or more of absorption currents, capacitive charging currents, leakage currents, capacitance, resistance, dielectric absorption (DA), polarization index (PI), high potential or hipot (high voltage) and step voltage responses, switching or lightning impulse voltage responses, and/or temperature. Further, measuring properties of the insulator in use with the measurement device may include conducting water penetration tests including one or more of hardness, steep-front impulse voltage, and power frequency voltage tests, and conducting one or more of low-frequency dry flashover tests, low-frequency wet flashover tests, critical impulse flashover tests, radio-influence voltage and/or salt fog-like tests on the insulator in use. Measuring properties of the insulator in use with the measurement device may also include optically evaluating surface properties including one or more of chalking, crazing, dry bands, tracking and/or erosion of the insulator in use. The measured properties may include DC properties and frequency-dependent properties of the insulator in use. The properties may be measured under test excitations at, below, or above a nominal power line frequency.

Method 700 may further include estimating a present-time and/or a future-time standoff voltage capability of the insulator, and/or a time-to-failure based on insulator properties measured by the measurement device and generating a recommended maintenance schedule for the insulator in use (730).

While various aspects and embodiments have been disclosed herein, other aspects and embodiments will be apparent to those skilled in the art. For example, the systems and methods described herein may include a test of insulator properties in response to a pulsed electric field of variable amplitude applied to an in-service insulator (e.g., insulator 130, FIG. 1C) at about a power line's (e.g., power line 110, FIG. 1C) voltage zero-crossing time-points. In the test, the pulsed electric field may be applied between the insulator's power line-gripping point (130C) and the local tower-arm (130T) to which the insulator is attached. The test may involve measuring the responsive (leakage) current flow through the insulator over a short time scale (e.g., ~microsecond). Such a short time scale, which is short compared to a voltage cycle in the power line (~1/power line frequency), may be sufficiently long for avalanching processes initiated by the applied electrical pulse to complete at atmospheric pressure. Any incipient electrical discharge resulting from application of the pulsed electric field in this manner may be expected to be quenched before the power-line voltage swings high. The short time-scale-of-testing may exploit the power lines' high inductance to effectively decouple the test-point of the insulator (e.g., 130C) from almost all of the power line (except possibly for a short local section). This manner of in-service testing of the voltage stand-off capability of in-service insulator 130 may allow power transmission line 110 to be exercised up to almost all of its present-time maximum voltage rating (e.g., up to 90%). Processing circuit 540 may be configured to compute an estimated voltage stand-off capability for the particular insulator based on the measured currents in response to the variable amplitude electrical pulses, and also to report the insulator capability in real time, for example, for real time management of power loads in the power transmission system.

An exemplary electricity network or grid delivers power from diverse centralized sources (e.g., hydroelectric, nuclear and coal power plants) and distributed sources (e.g., wind farms and solar photovoltaic arrays) to industrial and retail customers. In practice, the electricity network or grid may have complex topologies including multiple paths, loops, and bottlenecks that lead to inefficient use of grid infrastructure. The electricity network or grid may, for example, include multiple redundant lines between points on the network so that power can be routed from any power plant to any load center, through a variety of routes based on the economics of the transmission path and the cost of power.

Figure 8:
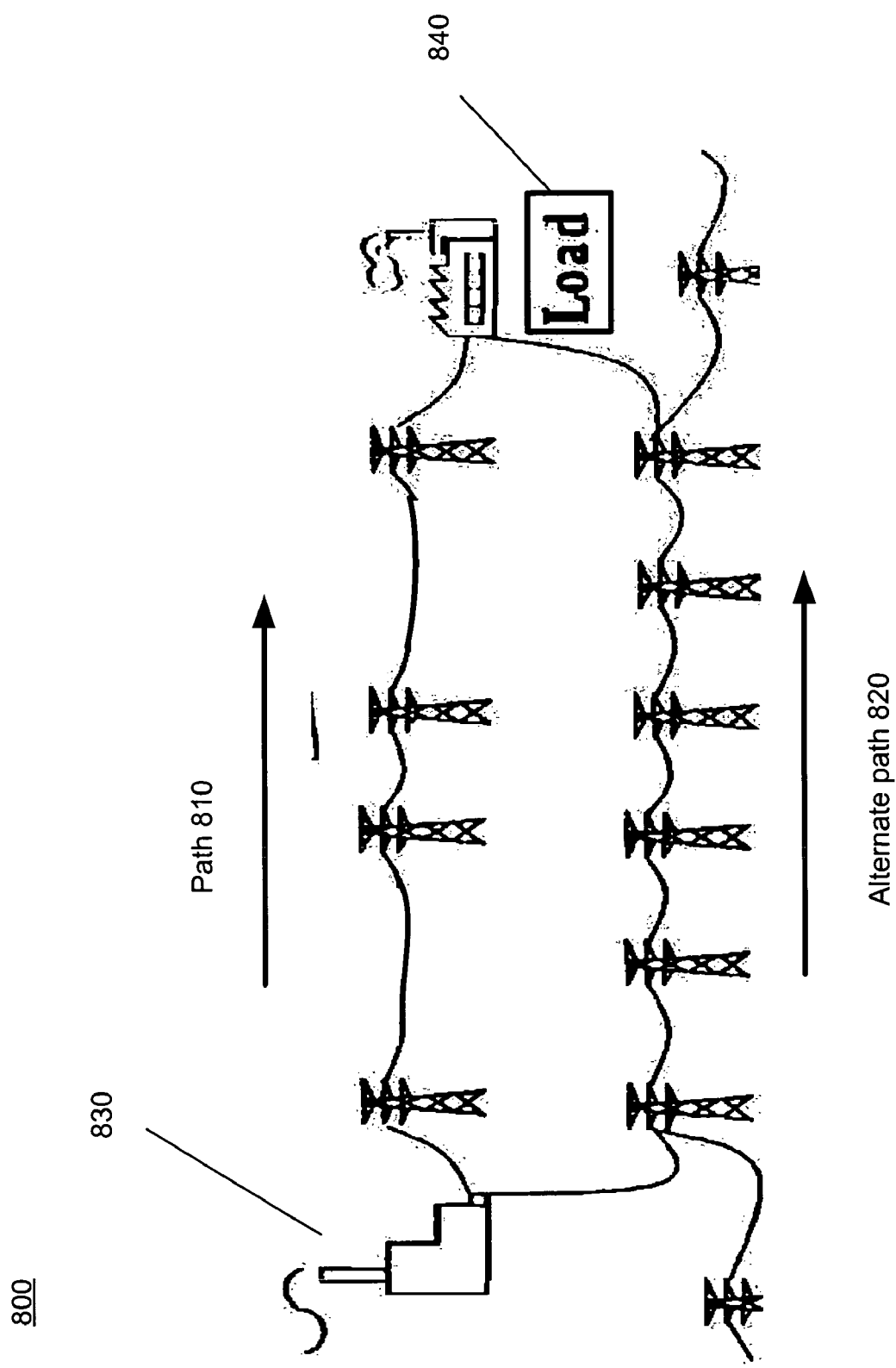
FIG. 8 is a schematic illustration of a portion of an electricity grid having two ac line or paths leading from a power source to a load.

FIG. 8 shows, for example, a portion of an electricity grid 800 having two ac lines or paths 810 and 820 leading from a power source 830 to a load 840. The power flow over each ac line path is a function of line end voltages, phase angle and line impedance. In an unmanaged or uncontrolled grid 100, electricity may, for example, flow from source 830 to load 840 along both paths 810 and 820 in inverse proportion to the relative impedances of the two transmission paths.

In a managed or controlled grid, it may be possible to vary parameters (e.g., series impedance, shunt impedance, phase angle, and occurrence of sub harmonic oscillations), which influence power flow in a particular transmission line. For example, grid 800 may include legacy mechanical controllers (e.g., mechanically switched devices such as tap changers, phase shifters, switched capacitors and reactors (inductance)) that allow control of the parameters affecting the power system. However, the mechanical controllers do not provide high speed control, and are prone to breakdown if used frequently. Alternatively of additionally, grid 800 may include electronic controllers (e.g., thyristor-based devices, high-speed phase angle regulators, high-speed variable series capacitors, varistors, Zener diodes, nonlinear resistors, static VAR compensators, braking resistors, etc.) that allow control of one or more AC transmission line parameters. Unlike the mechanical controllers, may be operated to provide high-speed control. The electronic controllers have been proposed for, or deployed in, recent grid installations to provide reactive power compensation (e.g., series inductive compensation, series capacitive compensation, and/or shunt compensation) for better and reliable grid utilization. While most common electronic controller devices (e.g., high-speed phase angle regulators, high-speed variable series capacitors, Static VAR compensators, braking resistors, etc.) are thyristor based, other electronic controller devices may be based on other semiconductor devices (e.g., BJTs, MOSFETs, and IGBTs, etc.).

Figure 9A:
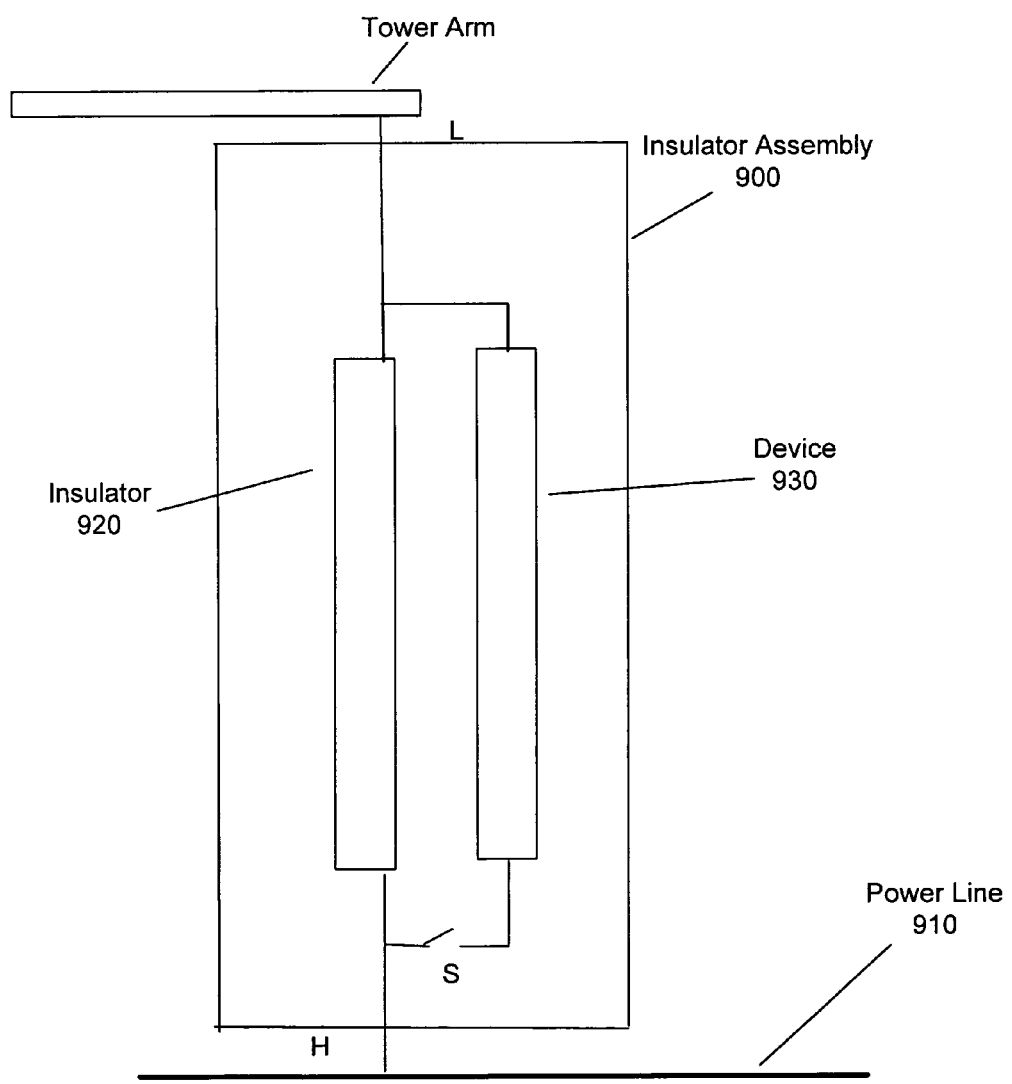
FIG. 9A is a block diagram illustrating an exemplary smart link or integrated insulator assembly including an insulator and a device, which can be passively or actively switched between two states, in accordance with the principles of the solutions described herein.

In an exemplary approach for electronic control of electricity grids or networks, a multi-purpose electrical device (hereinafter "smart link") is provided. A single or integrated smart link may be configured to perform different electrical functions or tasks in an electricity grid or network at different times or conditions. For example, a single smart link may be configured to operate variously as an ordinary line insulator and as a conductor. FIG. 9A shows an exemplary smart link or integrated insulator assembly 900, which can be passively or actively switched between two states by switch S. A high voltage end H of insulator assembly 900 may support or suspend a power line 910. Insulator assembly 900 may be coupled to power line 910 directly or indirectly (e.g., via transformer). A low voltage end L of insulator assembly 900 may be connected to ground, for example, via a tower arm (FIG. 8). Alternatively, low voltage end E of insulator assembly 900 may be connected to a like low voltage end of an insulator or insulator-assembly supporting another phase line.

In a first or normal state, insulator assembly 900 functions as a suspension (or strut) insulator 920 for electrically isolating power line 910. In a second or activated state, insulator assembly 900 functions, for example, as a device 930 that provides a parallel electrical path from high voltage end H to low voltage end E around or bypassing insulator 920.

Device 930 may be configured to carry real and/or reactive currents to or from power line 910. Device 930 may include any suitable switchgear circuits made of interconnected electrical and/or electronic elements such as resistors, reactors, capacitors, inductors, transistors, thyristors, EMF sources, and for sinks, etc. The switchgear circuits may be arranged to carry real and/or reactive currents transiently or continuously.

It will be understood that insulator 920 and device 930 are shown schematically in FIG. 9A as separate blocks only for convenience and ease of visualization. In practice, one or more elements or components of insulator 920 and device 930 (e.g., resistive or reactive elements) may be physically integrated and co-disposed in insulator assembly 900. Additionally or alternatively, one or more elements or components of insulator 920 and device 930 may be lumped at discrete locations within such an assembly. Further, one or more elements or components of device 930 (e.g., reactive elements) may be distributed along power line 910.

In an exemplary implementation of insulator assembly 900, the switchgear circuits of device 930 may include one or more grounding switches integrated with insulator 920. The grounding switches may be arranged to ground or divert currents from flowing through insulator 920, for example, in case of line and/or insulator fault. The grounding switches may have functionalities that are the same or similar to the functionalities as the grounding switches described, for example, in Annou et al. U.S. Pat. No. 5,638,254, Watanabe et al. U.S. Pat. No. 5,543,597, both of which are incorporated by reference herein in their entireties.

The switchgear circuits may include a resistor or other current-limiting circuit arranged to function as fault current limiters, lightening arresters, surge suppressors, and/or active grounding device. Further, the resistor may be coupled to suitable heat sinking elements that can absorb heat generated by current flow. The suitable heat sinking elements may be made of non-conducting materials, which have high specific heats (e.g., magnesium oxide, etc.), and/or phase-change materials, which absorb heat by phase change (e.g., melting, boiling, or sublimation). The phase change materials in a heat sinking element may be in thermal diffusion coupling to the resistor during current excursions. For this purpose, the resistor may have a finely divided current-flow path intermixed with the phase-change material. Further, heat sinking elements based on boiling or sublimation may have vapor channels to allow vapor to escape.

Conversely, the switchgear circuits may also include fusible elements that fuse or open circuit in response to onset of low impedance failure modes. The fusible elements may include reactive, capacitive, and/or inductive elements.

Additionally or alternatively, the switchgear circuits may include one or more voltage-variable resistors (varistors) arranged to protect insulator 920 and/or power line 910 against a lightning strike or other power surges. The varistors may be suitably arranged across a spark gap to dissipate lightning-bolt energy without a large fractional rise in local voltage driven by the lightning-bolt's current-injecting action.

Further, the switchgear circuits may include a dynamically insertable current limiter which is arranged to protect insulator 920 and/or power line 910. An exemplary insertable current limiter may be arranged to be inserted in series with insulator 920. The insertable current limiter may have functionality which is the same or similar the functionality of current limiters described, for example, in Knauer U.S. Pat. No. 3,982,158, and Barkan U.S. Pat. No. 4,184,186, both of which are incorporated by reference herein in their entireties.

Figure 9B:
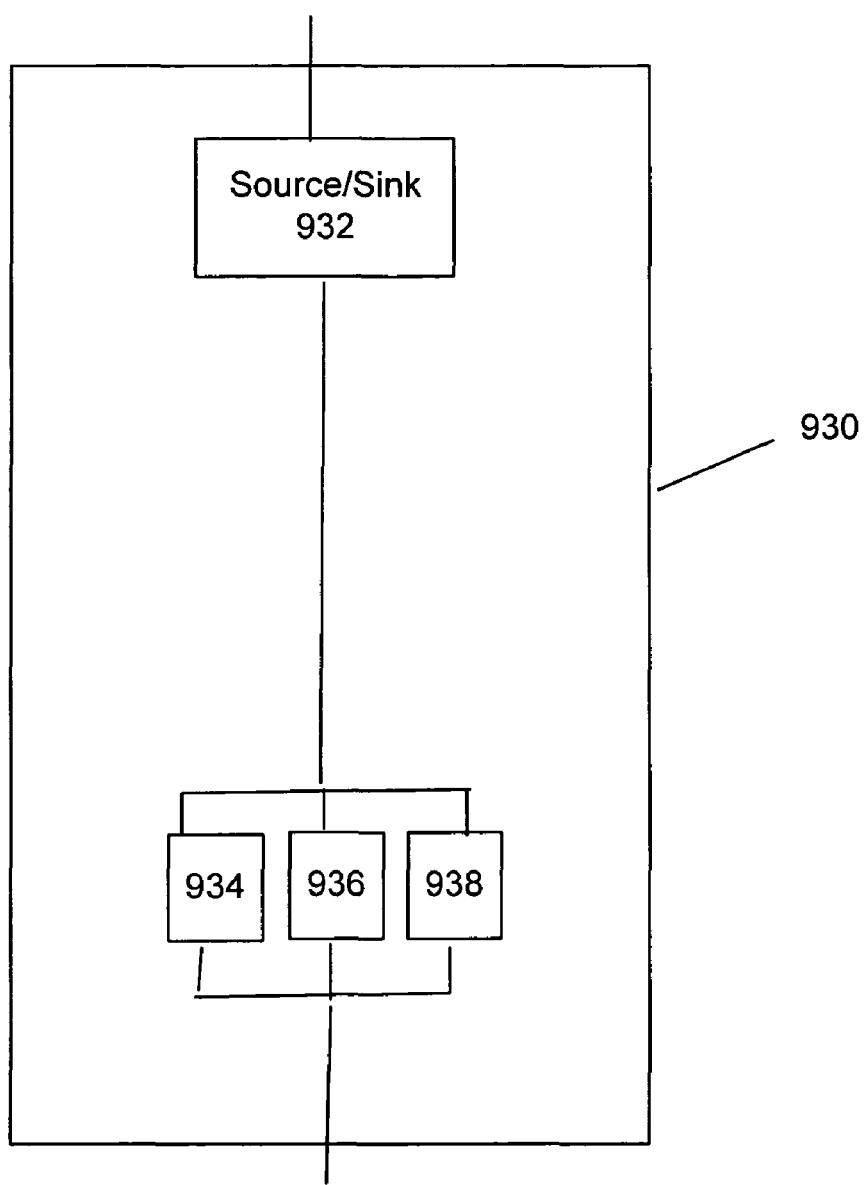
FIG. 9B is a block diagram illustrating exemplary components of the device of FIG. 9A, in accordance with the principles of the solutions described herein.

In another exemplary implementation of insulator assembly 900 (FIG. 9B), device 930 includes an EMF source or sink 932 (e.g., a battery, capacitor, etc.) coupled to a suitable inverter circuit. The inverter circuit may be configured to inject power into or sink power from power line 910, for example, to control power flow therein.

Additionally or alternatively, device 930 may include an active impedance module 934, which can be inductively coupled to power line 910 to inject a positive impedance, a negative impedance, and/or a voltage in power line 910. Active impedance module 934 may be configured to controllably couple a voltage source (e.g., source 932) via a transformer to individual phase-lines (e.g., line 910) of a transmission line. Active impedance module 934 may, for example, be a floating electrically isolated active impedance module that has functionalities which are the same or similar to the functionalities of an impedance module described, for example, in Divan et al. U.S. Pat. No. 7,105,952.

Additionally or alternatively, device 930 may include a transformless reactive compensation device 936. Transformless reactive compensation device 936 may be arranged to switchably introduce compensation in power line or insulator paths to control current values. Transformless reactive compensation device 936 may have functionalities which are the same or similar to the functionalities of a reactive series compensation device, which is described, for example, in Fujii et al. U.S. Pat. No. 6,242,895. Device 930 may further include suitable controller circuits for using transformless reactive compensation device 936 for single phase or multi-phase control.

Additionally or alternatively, device 930 may include a compensation generator 938, which can be switchably controlled to generate a voltage having a phase orthogonal to a phase of a power line current and/or to generate voltages for compensating voltage drops. Compensation generator 938 may have functionalities which are the same or similar to the functionalities of a series compensation generator, which is described, for example, in Mizutani et al. U.S. Pat. No. 6,172,488. In particular, compensation generator 938 may be configured to regulate an equivalent reactance of a power line and/or suppress power oscillations in the line.

With renewed reference to FIG. 9A, switch S may be any suitable mechanical, electro-mechanical or electronic switch. Switch S may, for example, be a solid-state switch, a semi-conductor-based switch, a photo-activated switch, an intrinsic silicon switch with photoinjection, an SCR, an IGBT, a thyristor, a gas-or-vacuum based switch, a crossed-field switch, an optoelectronic switch and/or an Austin-switch. Switch S may be apart of device 930 itself.

Switch S may be operated to switch insulator assembly 900 from its normal state as insulator 920 for electrically isolating power line 910 to its activated state as device 930 in parallel to insulator 920. Switch S may be a fast acting switch having switching actions occurring on power cycle or subcycle time scales. In operation, Switch S may be operated locally or remotely to activate device 930 to control power quality, reliability, efficiency, uptime, and safety.

Figure 10:
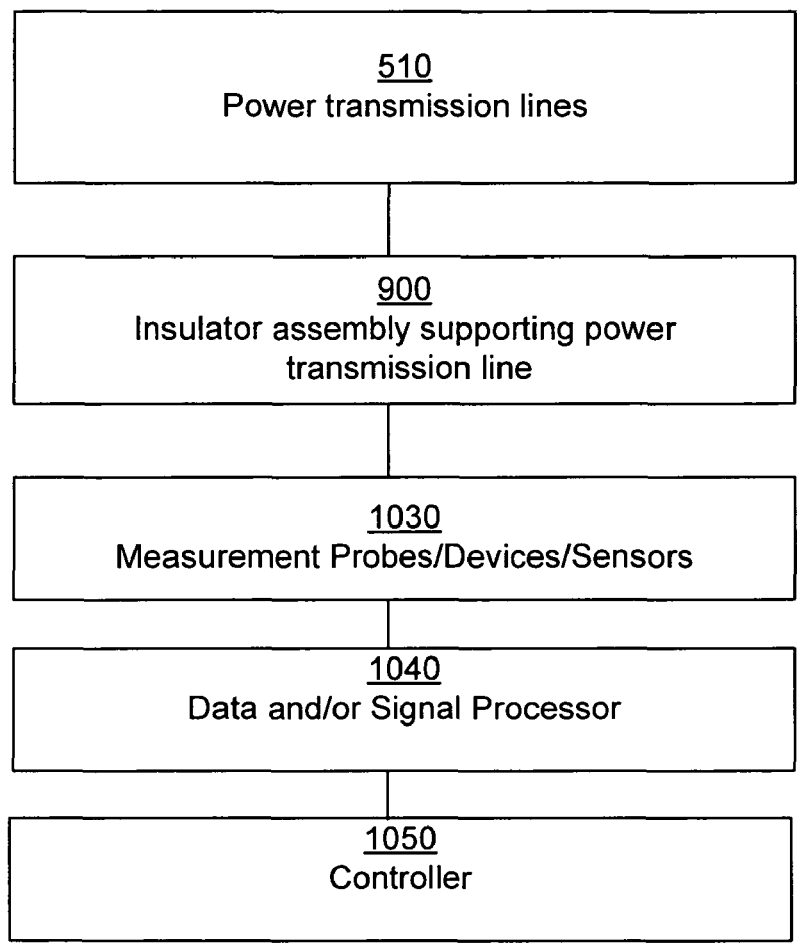
FIG. 10 is a block diagram illustrating exemplary components of a smart power delivery system, in accordance with the principles of the solutions described herein.

FIG. 10 shows an exemplary power delivery system 1000 utilizing integrated insulator assembly 900 to control power quality, reliability, efficiency, uptime, and/or safety. System 1000 includes power transmission lines 510 supported by one or more integrated insulator assemblies 900, which are coupled to measurement devices, probes and sensors (e.g., measurement devices 1030). Measurement devices 1030 may be coupled to a signal or data processing circuit 1040. Further, system 1000 may include a controller 1050 configured to coordinate operation of insulator assemblies 900, measurement devices 1030, processing circuit 1040 and other internal and external devices. Controller 1050 may have any suitable mechanical or electromechanical structure, and include an optional user interface.

Measurement devices 1030, like measurement devices 530 (FIG. 5), may include sensors configured to monitor insulator, line conditions and/or weather conditions or events. The measured properties may, for example, include one or more of absorption currents, capacitive charging currents, leakage currents, line currents and phase, capacitance, resistance, switching or lightning impulse voltage responses, and/or temperature. Further, measurement devices 1030, like measurement devices 530, may be interconnected to processing circuits and other internal or external devices (e.g., processing circuit 1040, controller 1050, status indicators, displays, etc.) using any suitable approaches including optical, electrical, wireless, pneumatic, and/or mechanical approaches. Processing circuit 1040 may be configured to receive and process data and/or signals from one or more measurement devices 1030 over the interconnections. Processing circuit 1040 may include any suitable combination of hardware and software for processing the data and/or signals. Processing circuit 1040 may determine operation of an insulator assembly 900 including operation of switch S and device 920. Processing circuit 1040 may include a decision making algorithm or routine configured to supervise operation of insulator assembly 900 for sourcing, sinking and dispatching of real and/or reactive power in order to meet load demands on system 1000. The algorithm may determine system 1000 and/or insulator assembly 900 responses to faults, transient events and/or steady-state operation. Processing circuit 1040 may be configured to report measurement data and processing results to other devices (e.g., controller 1050) and/or users.

One or more components or portions of system 1000 including measuring devices 1030, processing circuit 1040 and controller 1050 may be placed in or about insulator assemblies 900 (e.g., in physical cavities or portions of insulator 920). Alternatively or additionally, one or more components or portions of system 1000 may be placed in operational proximity in or about insulator assemblies 900 or at remote locations. One or more components of processing circuit 1040 and/or controller 1050 may, for example, be located in a remote building or facility and linked with system 1000 components through wireless, wired, IP protocol or other approaches.

Figure 11:
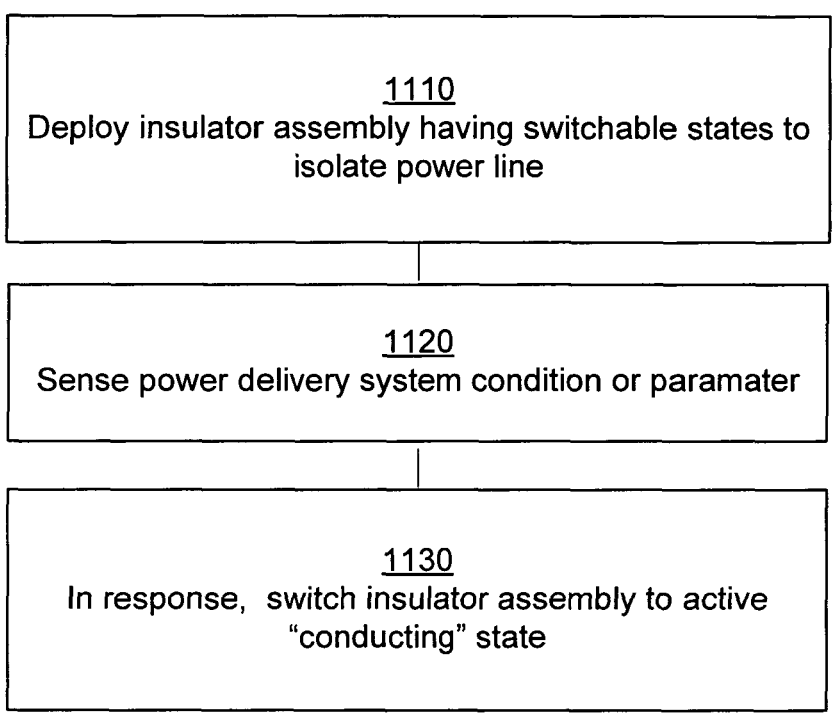
FIG. 11 is a flow diagram illustrating an exemplary method for smart power delivery, in accordance with the principles of the solutions described herein.

FIG. 11 shows exemplary features of a method 1100 for sourcing, sinking and dispatching of real and/or reactive power in order to meet load demands on power delivery system. Method 1100 utilizes an insulator assembly (e.g., assembly 900), which has two states—an insulator state and a parallel device state, to modify or regulate power delivery system parameters (e.g., series impedance, shunt impedance, phase angle, and occurrence of sub harmonic oscillations). Method 1100 includes deploying an insulator assembly, which is switchable between a normal isolating state and a reactive or conducting active state, to isolate a power line (1110), sensing a power delivery system condition (1120), and switching the insulator assembly to its active "conducting" state to source, sink and/or dispatch real and/or reactive power on the power delivery system (1130).

In the following detailed description, reference is made to the accompanying drawings, which form a part hereof. In the drawings, similar symbols typically identify similar components, unless context dictates otherwise. The illustrative embodiments described in the summary, detailed description, drawings, and claims are not meant to be limiting. Other embodiments may be utilized, and other changes may be made, without departing from the spirit or scope of the subject matter presented here. Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processing circuits (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processing circuits (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.). Further, those skilled in the art will recognize that the mechanical structures disclosed are exemplary structures and many other forms and materials may be employed in constructing such structures.

In a general sense, those skilled in the art will recognize that the various embodiments described herein can be implemented, individually and/or collectively, by various types of electro-mechanical systems having a wide range of electrical components such as hardware, software, firmware, or virtually any combination thereof; and a wide range of components that may impart mechanical force or motion such as rigid bodies, spring or torsional bodies, hydraulics, and electro-magnetically actuated devices, or virtually any combination thereof. Consequently, as used herein "electro-mechanical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs. Those skilled in the art will also appreciate that examples of electro-mechanical systems include but are not limited to a variety of consumer electronics systems, as well as other systems such as motorized transport systems, factory automation systems, security systems, and communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems for generation, transmission and distribution of electrical power, a communications system (e.g., a networked system, a telephone system, a Voice over IP system, wired/wireless services, etc.).

One skilled in the art will recognize that the herein described components (e.g., steps), devices, and objects and the discussion accompanying them are used as examples for the sake of conceptual clarity and that various configuration modifications are within the skill of those in the art. Consequently, as used herein, the specific exemplars set forth and the accompanying discussion are intended to be representative of their more general classes. In general, use of any specific exemplar herein is also intended to be representative of its class, and the non-inclusion of such specific components (e.g., steps), devices, and objects herein should not be taken as indicating that limitation is desired.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Figure 12:
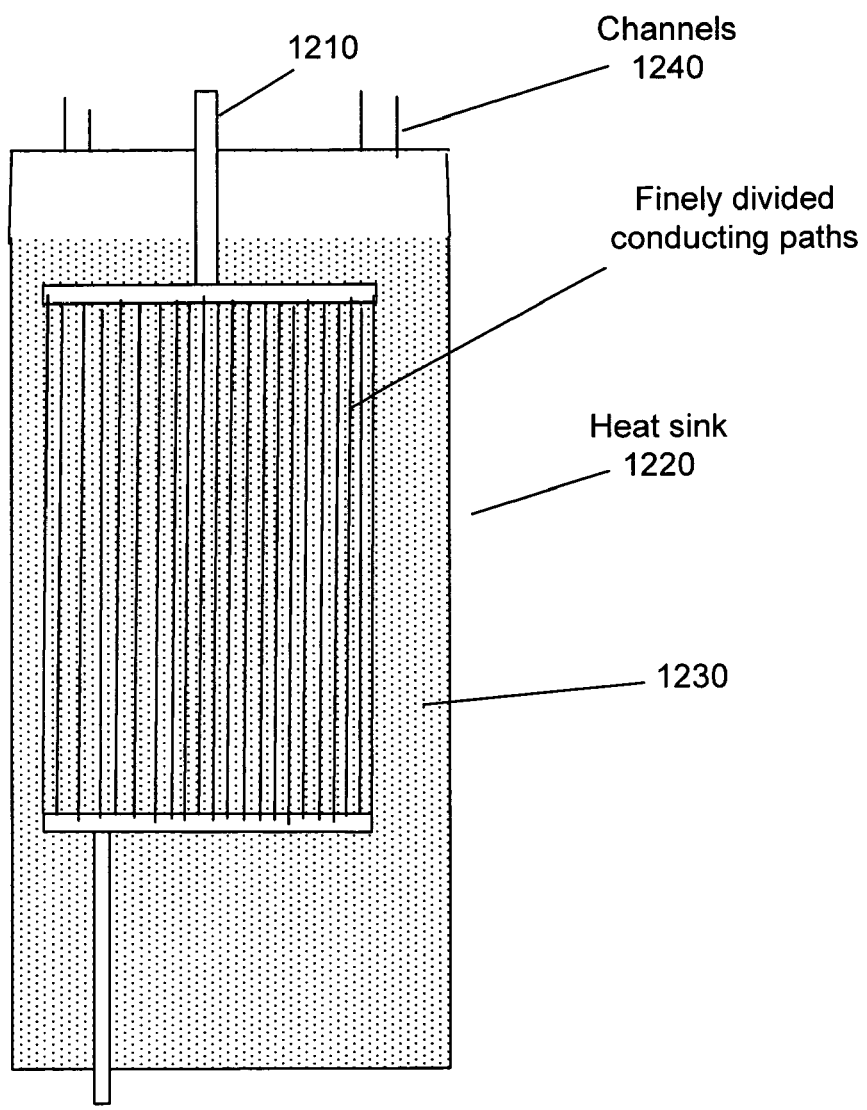
FIG. 12 is a block diagram illustrating an exemplary power line system component having temperature control or limiting features, in accordance with the principles of the solutions described herein.

While various aspects and embodiments have been disclosed herein, other aspects and embodiments will be apparent to those skilled in the art. For example, FIG. 12 shows a power line system component 1200 with temperature control or limiting features. Component 1200 includes a current carrying resistive element (e.g., resistor 1210). The resistive element may have linear or non-linear characteristics. Resistor 1210 may, for example, be a part of a current limiter, a lightning arrester, a surge suppressor, and/or an active grounding device. In particular, resistor 1210 may be a part of a switchable conductance placed in parallel with a power line insulator. In component 1200, resistor 1210 may be thermally coupled to heat sink 1220 made of material 1230 that absorbs heat by phase change.

Material 1230 may be electrically non-conductive. Heat sink 1220 and resistor 1210 may be co-disposed so that current carrying paths in the latter are adjoining or intermixed with material 1230 in the former. Material 1230 may absorb heat by melting, boiling, and/or sublimation. Heat sink 1220 may optionally include channels 1240 which allow escape of phase-changed material (e.g., vapor or fluids).

Figure 13:
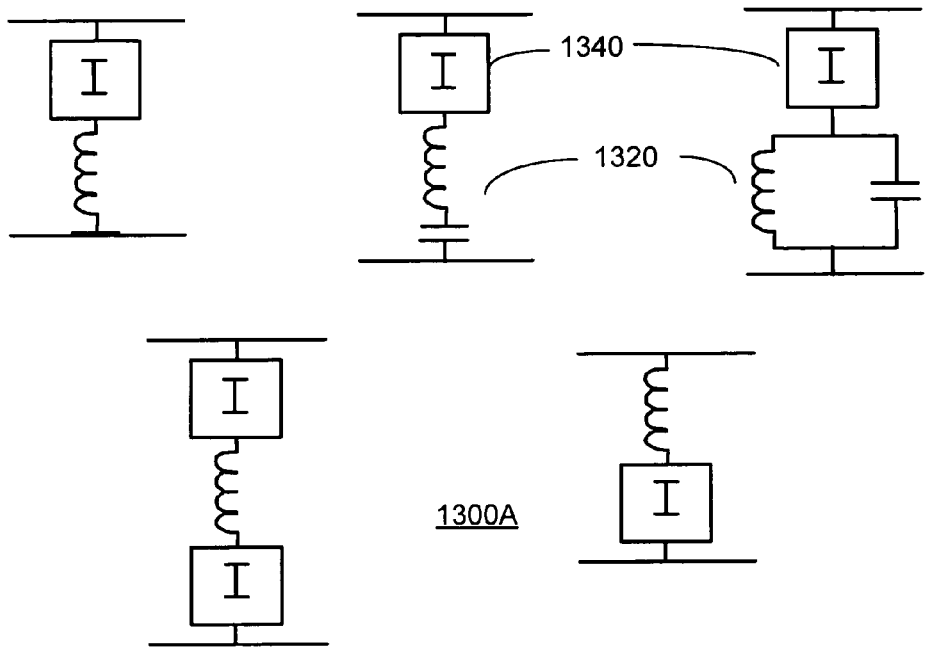
FIGS. 13A and B are a schematic diagram illustrating exemplary insulator components having various combinations of inductive elements and/or reactive elements and an insulator body, in accordance with the principles of the solutions described herein.
FIG. 13C is a flow diagram illustrating an exemplary method for dispatching power over a multi-line power delivery system, in accordance with the principles of the solutions described herein.
Figure 13:
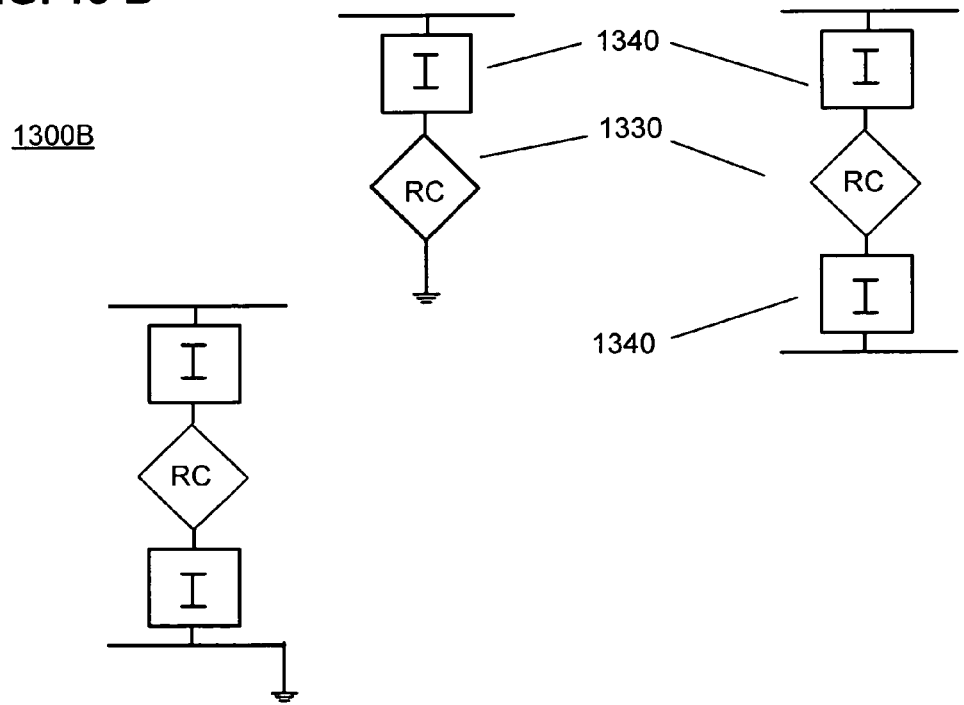

Further, for example, FIGS. 13A and 13B shows exemplary power delivery system components 1300A and 1300B configured to electrically isolate a high voltage power transmission line from another power line, ground or ground equivalent, and/or a neutral line. An end of an exemplary power delivery system component (1300A/B) may be indirectly connectable to the high voltage power transmission line (e.g., via a transformer). Components 1300A/B may include a virtual reactance.

Components 1300A/B may include various arrangements of suitable insulator bodies 1340 in series with inductive elements 1320 and/or reactive elements 1330 (hereinafter, collectively "reactive circuits 1320/30"). Portions of a reactive circuit and insulator body 1340 may be may co-disposed in a common physical structure. An end of a reactive circuit 1320/30 and/or an insulator body 1340 may be connectable the high voltage power transmission line. Further, one or more electrical circuit elements may be disposed in series and/or in parallel with reactive circuit 1320/30. The electrical circuit elements may, for example, include a portion of an active impedance module, a grounding switch, a lightning arrestor, a surge arrestor, an active grounding device, a dynamically insertable current limiter, an inverter, a transformerless reactive compensation device, a phase angle regulator, a variable series capacitor, a static VAR compensator, a varistor, a Zener diode, a nonlinear resistor, and/or a braking resistor.

Components 1300A/B may be variously configured to limit current flow through an insulator element 1340, inject power into and/or sink power from the high voltage power transmission line, and/or to introduce compensation in the high voltage power transmission line and/or insulator path to control current values (e.g., for single phase or multi-phase control). The components may be configured to generate a voltage having a phase substantially orthogonal to a phase of a power line current, generate voltages for compensating voltage drops in the power line, and/or regulate an equivalent reactance of the power line and/or suppress power oscillations in the power line.

An exemplary power delivery system may deploy suitable insulator element/reactive circuit combinations (e.g., components 1300A/B) to electrically isolate a high voltage power transmission line (e.g., a greater than about 70 kV power line), from another power line, ground or ground equivalent and/or a neutral line. The reactive circuits may be configured to inject power into and/or sink power from the high voltage power transmission line introduce compensation in the high voltage power transmission line and/or insulator path to control current values (e.g., in the high voltage power transmission line and/or insulator path for single phase or multi-phase control), generate a voltage having a phase substantially orthogonal to a phase of a power line current and/or to generate voltages for compensating voltage drops in the power line, and/or regulate an equivalent reactance of the power line and/or suppress power oscillations in the power line.

Figure 13C:
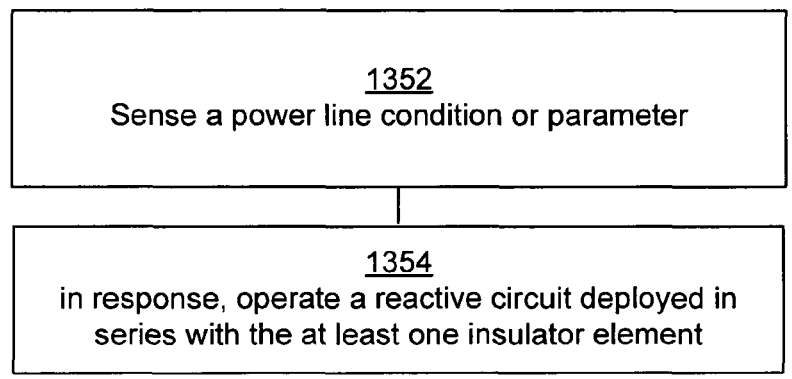

FIG. 13C shows an exemplary method 1350 for operating a power delivery system which uses insulator element/reactive circuit combinations (e.g., components 1300A/B) to electrically isolate a high voltage power transmission line. Method 1350 includes sensing a power line condition or parameter (1352), and in response, operating the reactive circuit deployed in series with the at least one insulator element (1354).

Sensing a power line condition or parameter (1352) may, for example, include sensing a power line condition or parameter that comprises sensing a breakdown or an anticipated breakdown of the at least one insulator element, sensing a rising voltage across the at least one insulator element, sensing or predicting a voltage rise due to measured properties elsewhere on the power line and/or predicting an imminent lightning strike and/or atmospheric potential disturbance.

Operating the reactive circuit (1354) may include, for example, operating a plurality of reactive circuits deployed in series with a respective plurality of insulator elements for distributed sourcing, sinking, and/or dispatching real and/or reactive power on the power line, modifying a power line series impedance and/or shunt impedance, introducing a virtual reactance in the power line, modifying a power line phase angle, modifying an occurrence of sub harmonic oscillations on the power line, and/or limiting a current flow across the at least one insulator element. Limiting a current flow across the at least one insulator element may include, for example, diverting the current through a current limiter, a lightning arrester, a surge suppressor, and/or a grounding device, and/or a selected combination of a resistive circuit and/or a reactive element to dissipate power. Limiting a current flow across the at least one insulator element also may, for example, include diverting a current through a resistive device, resistor, and/or varistor, which are thermally coupled to a heat sink to dissipate real power. The heat sink may be made of materials that undergo a phase change to absorb heat (as shown e.g., FIG. 12).

Additionally or alternatively, operating the reactive circuit (1354) may, for example, include, indirectly or directly coupling the reactive circuit to the power line. introducing reactive compensation in the power line and/or an insulator path for single phase or multi-phase control, generating a voltage having a phase substantially orthogonal to a phase of the power line current, generating voltages for compensating voltage drops in the power line, regulating an equivalent reactance of the power line and/or suppressing power oscillations in the power line, coupling an EMF-source and/or sink to the power line, and/or activating a circuit element that is configured to open circuit in response to an onset of a low-impedance failure mode.

Figure 14A:
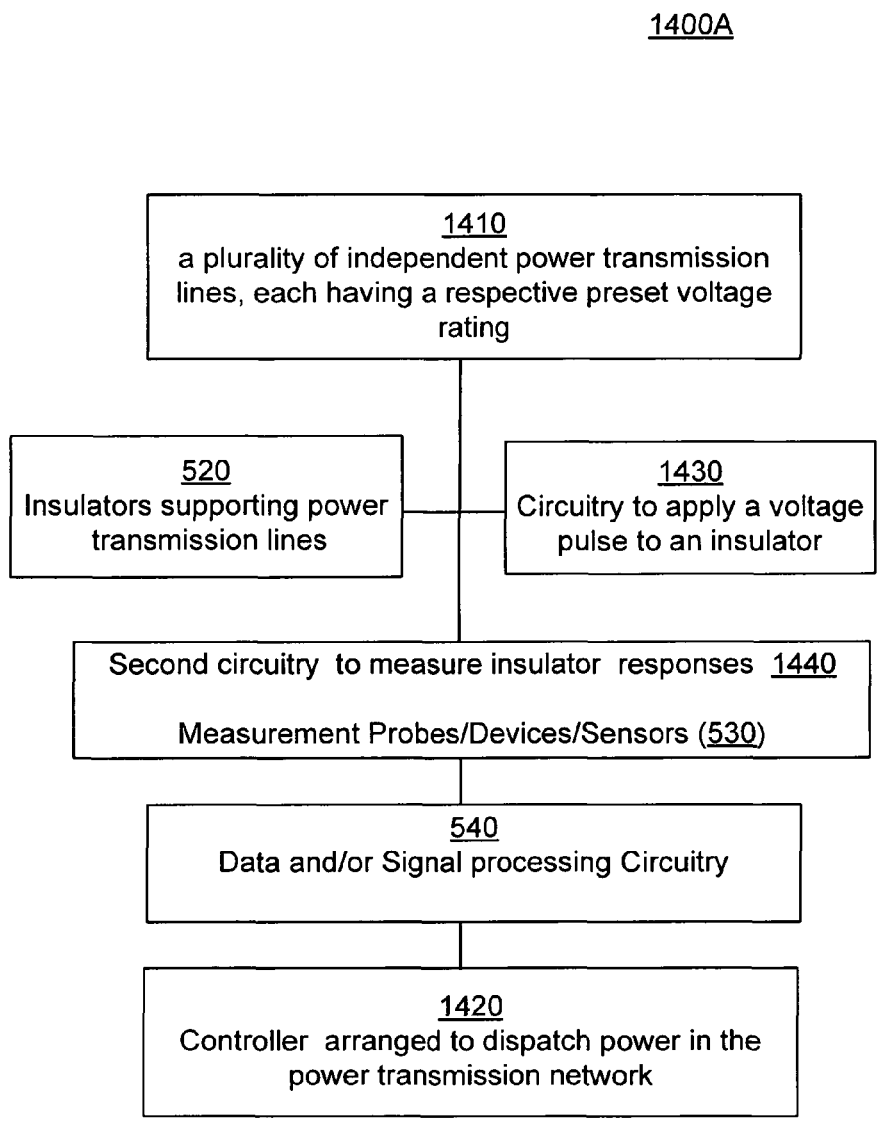
FIG. 14A is a block diagram illustrating exemplary components of a power delivery system, in accordance with the principles of the solutions described herein.

Further, for example, FIGS. 14A and 14B respectively show an exemplary power delivery system 1400A and an exemplary method 1400B for measuring characteristics of power delivery system including the voltage/current capabilities of line components.

Power delivery system 1400A may include a power transmission network (1410) having a plurality of independent power transmission lines, each having a respective preset voltage rating or power capacities. System 1400A includes a first 1430 and a second circuitry 1440 configured to apply a voltage pulse to an insulator in use to electrically isolate a live power line and to measure insulator responses, respectively. The applied voltage pulse may have high frequency components so that the response of an insulator is substantially independent of properties of the live power line.

First circuitry 1430 may be configured to apply a variable amplitude electrical pulse between about a power line gripping end and an opposite end of the insulator in use to electrically isolate the power transmission line, for example, at about times corresponding to zero voltage crossing times in the power transmission line. The variable amplitude electrical pulse may be applied ahead of a zero voltage crossing, which may correspond to a situation where the insulator undergoes a reversal in the polarity of voltages across it during testing.

Second circuitry 1440 may be configured to measure a response to an applied variable amplitude electrical pulse on a time scale that is a fraction of a power cycle in the power transmission line, and during select portions of power cycles properties in which properties of a power line gripping end of the insulator are, for example, substantially independent or decoupled from power flowing in power transmission line.

System 1400A may include additional or alternative measurement devices (e.g., Measurement Probes/Devices/Sensors 530), which may be in physical or sensing contact with the insulators, and any suitable data and/or signal processing circuitry (e.g., data and/or signal processing circuitry 540). Measurement Probes/Devices/Sensors 530 and/or second circuitry 1440 may be configured to estimate a voltage standoff capability of an insulator in use. The estimated voltage standoff capability may be a present-time and/or a future-time standoff voltage capability.

Like the components of system 500, the components of system 1400A may be configured to evaluate or determine the actual voltage ratings or power capacities of the independent power transmission lines in use. These actual voltage ratings or capabilities may be different than preset voltage ratings or power capacities of the lines.

System 1400A may further include a controller (1420), which is configured to receive measured actual voltage capabilities of one or more of the plurality of independent power transmission lines in use. Controller 1420 may be further configured to dispatch power over the plurality of independent power transmission lines according to the measured actual voltage capabilities of the one or more independent power transmission lines in use.

In a version of system 1400A, system components may be configured to measure the voltage capabilities of several of insulators simultaneously or at about the same time. In this version, system components (e.g., first and second circuitries 1430 and 1440) may be configured to apply a voltage pulse to an end of section of a power transmission line isolated by a number of insulators measure the properties of more than one insulator supporting a power line. The voltage pulse width or frequencies may be suitably tailored to isolate the section of the power transmission line, and properties of the number of insulators supporting the isolated section may be determined by measuring reflected responses of the number of insulators to the applied voltage pulse. A suitably tailored applied voltage pulse for this purpose may have a frequency of about 1 KHz.

With reference to FIG. 14B, method 1400B may include applying a voltage pulse (e.g., variable amplitude pulse) to an insulator in use to electrically isolate a live power line (1452), and measuring a response of the insulator to the applied voltage pulse (1454). The applied voltage pulse may be applied between about a power line gripping end and an opposite end of the insulator in use to electrically isolate the power transmission line. Further, the applied voltage pulse may have high frequency components so that the response of the insulator is substantially independent or isolated from properties of the live power line (e.g., because of its inductance). The applied voltage pulse may be applied at about times corresponding to zero voltage crossing times in the power transmission line (e.g., ahead, behind, or straddling a zero voltage crossing). Measuring a response of the insulator to the applied voltage pulse (1454) may, for example, include measuring a response to an applied variable amplitude electrical pulse on a time scale that is a fraction of a power cycle in the power transmission line, measuring insulator properties during select portions of power cycles in which properties of a power line gripping end of the insulator are substantially independent or decoupled from power flowing in power transmission line.

FIG. 15 shows an exemplary method 1500 for dispatching power over multi-line power transmission system (e.g., systems 200, 500, 800, 1000, 1400A, etc.) in which each line has a preset voltage rating or power carrying capability. Under some situations or conditions, an actual power capability of a transmission line may be a trivial 0% or 100% of the preset voltage rating or power carrying capability. In practical situations, it is likely that the actual power capability of a transmission line may be a substantial or non-trivial fraction (e.g., 1% to 99%) or multiple (e.g., >1.01) of the preset voltage rating or power carrying capability. Method 1500 includes measuring actual voltage capabilities of one or more of the plurality of independent power transmission lines in use (1552), and dispatching power over the plurality of independent power transmission lines according to the measured actual voltage capabilities of the one or more independent power transmission lines in use (1554). Measuring actual voltage ratings or power carrying capabilities 1552 may be accomplished by employing any suitable method (e.g., method 1400B). Method 1500 may be applied to dynamically optimize dispatching power over and/or loading of power lines over a range of non-trivial actual conditions in a multi-line power transmission system (e.g., under which an actual power capability of a transmission line is not a trivial 0% or 100% of power rating).

Further, it will be understood that the various devices and device components described herein may be made using any suitable manufacturing or fabrication technologies. For example, devices and device components (e.g., surface reconditioner 230, sensor 240, heaters, electrodes A and B, electrical and/or mechanical sensors, measurement devices 530, processing circuit 540, switches S, measurement device 720, device 930, resistive, reactive elements, measurement devices 1030, signal or data processing circuit 1040, circuits, switchable conductances, component 1200, etc) that are co-disposed with insulator elements may be fabricated by depositing and patterning conductive thin films on insulator surfaces. Exemplary conductances or other circuits elements be made from electrically conducting coating materials (e.g., indium tin oxide) applied to glass and other ceramic insulator bodies.

The various aspects and embodiments disclosed herein are for purposes of illustration and are not intended to be limiting, with the true scope and spirit being indicated by the following claims.

The invention claimed is:

1. A system, comprising:
   an insulator arranged to electrically isolate a power transmission line that is in use to transmit electrical power as part of an electrical power transmission network; and
   a device in physical contact with the insulator,
   wherein the device is arranged to apply test excitations to the insulator in use and to determine in response to the applied test excitation properties of the insulator in use to electrically isolate the power transmission line.

2. The system of claim 1. wherein at least a portion of the device is disposed within a body of the insulator.

3. The system of claim 1, wherein the device is arranged to estimate a voltage standoff capability of the insulator in use.

4. The system of claim 1, wherein the device is arranged to measure one or more of absorption currents, capacitive charging currents, leakage currents, capacitance, resistance, dielectric absorption (DA), polarization index (PI), high potential or hipot (high voltage) and step voltage responses, switching or lightning impulse voltage responses, and/or temperature of at least a portion of the insulator in use.

5. The system of claim 1, wherein the device is arranged to conduct one or more of low-frequency dry flashover tests, low-frequency wet flashover tests, critical impulse flashover tests, radio-influence voltage and/or salt fog-like tests on the insulator in use.

6. The system of claim 1, wherein the device is arranged to measure a resistance or conductance of at least a portion of the insulator in use.

7. The system of claim 1, wherein the device is arranged to measure one or more frequency-dependent properties of the insulator in use.

8. The system of claim 1, wherein the device is arranged to measure ambient power line leakage currents across the insulator in use.

9. The system of claim 1, wherein the device is arranged to measure leakage currents across the insulator in response to test excitations that are a nominal power line frequency, or at higher frequency than a nominal power line frequency.

10. The system of claim 1, wherein the device is arranged to measure electrical potentials or fields on or proximate to the insulator in use under ambient power line conditions and in response to test excitations.

11. The system of claim 1, wherein the device comprises circuitry configured to estimate a standoff voltage capability of the insulator in use based on insulator properties measured by the device.

12. The system of claim 1, wherein the device comprises circuitry configured to estimate a present-time and/or a future-time standoff voltage capability of the insulator in use based on insulator properties measured by the device.

13. The system of claim 1, wherein the device comprises circuitry configured to provide a time-to-failure estimate for the insulator in use based on insulator properties measured by the device.

14. The system of claim 1, further comprising, circuitry coupled to the device, wherein the circuitry is configured to report a status or condition of the insulator in use based on insulator properties measured by the device.

15. The system of claim 14, wherein the circuitry is configured to compute and report a time-to-failure and/or a recommended maintenance schedule for the insulator in use.

16. The system of claim 1, wherein the device is configured to apply a variable amplitude electrical pulse between about a power line gripping end and an opposite end of the insulator in use to electrically isolate the power transmission line.

17. The system of claim 1, wherein the device is configured to apply a variable amplitude electrical pulse at about times corresponding, to zero voltage crossings in the power transmission line.

18. The system of claim 17, wherein, the device is configured to apply a variable amplitude electrical pulse ahead of a zero voltage crossing.

19. The system of claim 1, wherein the device is configured to measure a response to an applied variable amplitude electrical pulse on a time scale that is a fraction of a power cycle in the power transmission line.

20. The system of claim 1, wherein the device is further configured to measure insulator properties during select portions of a power cycle in the power transmission line, wherein during the select portion of the power cycle properties of a power line gripping end of the insulator are substantially independent or decoupled from power flowing in the power transmission line.

21. A system comprising:
   an insulator arranged to electrically isolate a power transmission line that is in use to transmit electrical power as a part of an electrical power transmission network; and
   a device in physical contact with the insulator,
   wherein the device is arranged to optically evaluate surface properties including one or more of chalking, crazing, dry bands, tracking and/or erosion of the insulator in use.

22. An electrical insulator, comprising:
   an insulator body having a surface, wherein the insulator body is adaptable in use to electrically isolate a power transmission line that is in use to transmit electrical power as part of an electrical power transmission network; and a device in physical contact with the insulator body, wherein the device is arranged to measure properties of the insulator body by applying test excitations to the insulator body while the insulator is in use to electrically isolate the power transmission line.

23. The electrical insulator of claim 22, wherein at least a portion of the device is disposed within the insulator body.

24. The electrical insulator of claim 22, wherein the device is arranged to estimate a voltage standoff capability of the insulator in use.

25. The electrical insulator of claim 22, wherein the device is arranged to measure one or more of absorption currents, capacitive charging currents, leakage currents, capacitance, resistance, dielectric absorption (DA), polarization index (PI), high potential or hipot (high voltage) and step voltage responses, switching or lightning impulse voltage responses, and/or temperature of at least a portion of the insulator in use.

26. The electrical insulator of claim 22, wherein the device is arranged to conduct one or more of low-frequency dry flashover tests, low-frequency wet flashover tests, critical impulse flashover tests, radio-influence voltage and/or salt fog-like tests on the insulator in use.

27. The electrical insulator of claim 22, wherein the device is arranged to optically evaluate surface properties including one or more of chalking, crazing, dry bands, tracking and/or erosion of the insulator in use.

28. The electrical insulator of claim 22, wherein the device is arranged to measure a resistance or conductance of at least a portion of the insulator in use.

29. The electrical insulator of claim 22, wherein the device is arranged to measure one or more frequency-dependent properties of the insulator in use.

30. The electrical insulator of claim 22, wherein the device is arranged to measure ambient power line leakage currents through the insulator, and/or leakage currents through the insulator in response to test excitations.

31. The electrical insulator of claim 22, wherein the device is arranged to measure leakage currents through the insulator in response to test excitations that are at a nominal power line frequency, and/or at higher frequency than a nominal power line frequency.

32. The electrical insulator of claim 22, wherein the device is arranged to measure electrical potentials or fields on or proximate to the insulator in use under ambient power line conditions, and/or in response to test excitations.

33. The electrical insulator of claim 22, wherein the device comprises circuitry configured to estimate a present-time and/or a future-time standoff voltage capability of the insulator in use based on insulator properties measured by the device.

34. The electrical insulator of claim 22, further comprising, circuitry coupled to the device, wherein the circuitry is configured to report a status or condition of the insulator in use based on insulator properties measured by the device.

35. The electrical insulator of claim 34, wherein the circuitry is configured to compute and report a present and/or a future condition or property value of the insulator in use.

36. The electrical insulator of claim 22, wherein the device is configured to apply a variable amplitude electrical pulse between about a power line gripping end and an opposite end of the insulator in use to electrically isolate the power transmission line.

37. The electrical insulator of claim 22, wherein the device is configured to apply a variable amplitude electrical pulse at about times corresponding to zero voltage crossing times in the power transmission line.

38. The electrical insulator of claim 37, wherein the device is configured to apply a variable amplitude electrical pulse ahead of a zero voltage crossing.

39. The electrical insulator of claim 22, wherein the device is configured to measure insulator properties during select portions of power cycles in the power transmission line, wherein during the select portions of the power cycles properties of a power line gripping end of the insulator are substantially independent or decoupled from power flowing in the power transmission line.

40. The electrical insulator of claim 22, further comprising circuitry arranged to report measured insulator properties to an external device, controller, and/or display.

\* \* \* \* \*

UNITED STATES PATENT AND TRADEMARK OFFICE
CERTIFICATE OF CORRECTION

| | | |
|---|---|---|
| PATENT NO. | : 8,174,270 B2 | Page 1 of 1 |
| APPLICATION NO. | : 12/460455 | |
| DATED | : May 8, 2012 | |
| INVENTOR(S) | : Roderick A. Hyde et al. | |

It is certified that error appears in the above-identified patent and that said Letters Patent is hereby corrected as shown below:

Title Page:

The Related U.S. Application Data (63) is missing on page 1, insert:
-- Continuation-in-part of application No. 12/460,455 filed on July 17, 2009, and a continuation-in-part of application No. 12,460,452 filed on July 17, 2009. --

Column 28, Line 41, "corresponding, to zero voltage crossings in the power trans-" should be changed to -- corresponding to zero voltage crossings in the power trans- --

Signed and Sealed this
Fourth Day of September, 2012

David J. Kappos
*Director of the United States Patent and Trademark Office*